(12) United States Patent
Noel et al.

(10) Patent No.: US 10,311,529 B1
(45) Date of Patent: Jun. 4, 2019

(54) SYSTEMS, MEDIA, AND METHODS OF APPLYING MACHINE LEARNING TO CREATE A DIGITAL REQUEST FOR PROPOSAL

(71) Applicant: Emprove, Inc., Las Vegas, NV (US)

(72) Inventors: James Noel, Las Vegas, NV (US);
Shih-Chien Lee, San Mateo, CA (US);
Ervi Susanti Ali Bongso, Burlingame, CA (US)

(73) Assignee: EMPROVE, INC., Las Vegas, NV (US)

( * ) Notice: Subject to any disclaimer, the term of this patent is extended or adjusted under 35 U.S.C. 154(b) by 0 days.

(21) Appl. No.: 16/000,750

(22) Filed: Jun. 5, 2018

(51) Int. Cl.
| | |
|---|---|
| *G06Q 30/00* | (2012.01) |
| *G06Q 50/08* | (2012.01) |
| *G06Q 30/02* | (2012.01) |
| *G06F 17/50* | (2006.01) |
| *G06Q 30/06* | (2012.01) |
| *G06N 20/00* | (2019.01) |

(52) U.S. Cl.
CPC ......... *G06Q 50/08* (2013.01); *G06F 17/5004* (2013.01); *G06N 20/00* (2019.01); *G06Q 30/0283* (2013.01); *G06Q 30/0611* (2013.01)

(58) Field of Classification Search
CPC .............. G06Q 50/08; G06Q 30/0611; G06Q 10/06313; G06Q 10/0637; G06Q 30/00; G06Q 30/0283
USPC .............................................. 705/26.1, 27.1
See application file for complete search history.

(56) References Cited

U.S. PATENT DOCUMENTS

| | | | |
|---|---|---|---|
| 5,189,606 A | 2/1993 | Burns et al. | |
| 5,767,848 A | 6/1998 | Matsuzaki et al. | |
| 5,793,632 A | 8/1998 | Fad et al. | |
| 5,815,638 A | 9/1998 | Lenz et al. | |
| 6,275,987 B1 | 8/2001 | Fraley et al. | |
| 6,351,734 B1 | 2/2002 | Lautzenheiser et al. | |
| 6,445,968 B1 | 9/2002 | Jalla et al. | |
| 6,446,053 B1 | 9/2002 | Elliott et al. | |
| 6,556,992 B1 | 4/2003 | Barney et al. | |
| 6,738,736 B1 | 5/2004 | Bond et al. | |
| 6,810,383 B1 | 10/2004 | Loveland et al. | |
| 6,973,441 B1 | 12/2005 | Jaggi et al. | |
| 8,458,009 B1 * | 6/2013 | Southworth | G06Q 10/06 705/1.1 |
| 2002/0026343 A1 | 2/2002 | Duenke et al. | |
| 2003/0018952 A1 | 1/2003 | Roetzheim et al. | |
| 2003/0055702 A1 | 3/2003 | Waterston et al. | |
| 2003/0070157 A1 | 4/2003 | Adams et al. | |
| 2003/0225605 A1 | 12/2003 | Yokota et al. | |
| 2004/0093474 A1 | 5/2004 | Lin et al. | |

(Continued)

OTHER PUBLICATIONS

Anonymous, "HomeZada Taps Pinterest for DIY Projects," Wireless News, May 24, 2012.*

*Primary Examiner* — Brandy A Zukanovich
(74) *Attorney, Agent, or Firm* — Wilson Sonsini Goodrich & Rosati

(57) ABSTRACT

Disclosed herein are systems, media, and methods of applying machine learning to create a digital request for proposal for use in property construction and improvement. Consumers are enabled by the systems, media, and methods disclosed herein to compose property improvement proposals and generate electronic documentation to assist contractors in evaluating said proposals and providing bids for the completion of the proposed property improvement.

23 Claims, 41 Drawing Sheets

(56) References Cited

U.S. PATENT DOCUMENTS

| | | |
|---|---|---|
| 2004/0148209 A1 | 7/2004 | Church et al. |
| 2004/0148294 A1 | 7/2004 | Wilkie et al. |
| 2004/0186757 A1 | 9/2004 | Starkey et al. |
| 2004/0194055 A1 | 9/2004 | Galloway et al. |
| 2005/0240903 A1 | 10/2005 | Lake et al. |
| 2006/0106657 A1 | 5/2006 | Pollak et al. |
| 2007/0073593 A1 | 3/2007 | Perry et al. |
| 2012/0265633 A1 | 10/2012 | Wohlstadter et al. |
| 2014/0095122 A1 | 4/2014 | Appleman et al. |
| 2014/0222608 A1* | 8/2014 | Cohen ................ G06Q 30/0283 705/26.4 |

* cited by examiner

SYSTEMS, MEDIA, AND METHODS OF APPLYING MACHINE LEARNING TO CREATE A DIGITAL REQUEST FOR PROPOSAL

INCORPORATION BY REFERENCE

All publications, patents, and patent applications mentioned in this specification are herein incorporated by reference to the same extent as if each individual publication, patent, or patent application was specifically and individually indicated to be incorporated by reference.

BACKGROUND OF THE INVENTION

An estimate of over $260 billion dollars was spent by homeowners on home improvement in 2017. Home improvement is rising at 6% annually nationwide, owing in part to an increase in homeowners undertaking major renovations rather than performing basic maintenance and repairs. Many employ the aid of service providers to construct improvements or provide building materials.

As technology advances, consumers spend an increasing amount of their time online to learn about the marketplace and to purchase goods and services.

SUMMARY OF THE INVENTION

There are numerous challenges a consumer faces when wanting to improve their home or other real estate property. In some situations, the process of hiring a contractor may require: (1) the contractor reviewing the improvement site; (2) the contractor and consumer discussing the improvement goals; (3) the contractor calculating the cost of the project by factoring in building materials, labor, desired profit, and any auxiliary costs; and; (4) the contractor providing a quote to the consumer. This process is often repeated by the consumer with a multitude of contractors.

The drawbacks to this process are significant. First, time is spent by both the contractor and the consumer to evaluate the site and discuss the goals of the project. In the case of home improvements, the travel time of the contractor is often greater than that of the consumer, and there is no guarantee that the travel will yield an agreement. The consumer may also suffer from wasted time, in that for every new contractor, the same construction goals must be recommunicated. Next, when discussing the goals of the project, communication between the parties may be inadequate or if the two parties understand the exchanged communicated terms to have different meanings. This problem can arise in the arena of home design, as indefinite and artistic terms have become entrenched in the field's lexicon. For example, a "sleek counter top" may mean a "smooth" counter top to one party and a counter top with a "modern design" to another. Pictures are often needed to provide examples, but such examples may be cumbersome to transport, and may require time to review. Finally, as both consumer and contractor must arrive at an agreement with imperfect information, suboptimal agreements can be formed. Often, the contractor provides the consumer a quote without a breakdown of the costs to the improvement (e.g., materials, labor, profits, travel costs, city approvals, etc.). This is problematic when the consumer compares quotes between contractors, as the consumer cannot effectively compare the costs of the parties. For example, the consumer may not know that a contractor plans to offset heavy travel costs by reducing the quality of the building materials. The contractor also suffers from a lack of transparency, as the contractor cannot provide an optimal price for services. The contractor may bid too high and be passed over for the contract, or bid too low and commit to a low profit project.

These challenges are only compounded when a consumer attempts a similar project by going online. While the consumer may have greater access to a pool of potential contractors or online websites that depict images and features of design elements, this greater access may be detrimental to consumers—leaving consumers confused and overwhelmed with the myriad of options provided in a disparate and incoherent manner. No technological tool exists for consumers to effectively filter through the data elements, translate a consumer's design preferences into an actionable request for proposal for a contractor, educate the consumer of the breakdown of costs as the scope of the project adapts, and empower consumers to initiate and complete their projects with clarity and confidence.

The present disclosure addresses these challenges unique to a technological environment. Disclosed herein, are computer-implemented systems, media, and computer-implemented methods wherein a consumer assists in generating a digital request for proposal (RFP) and contractors in response provide project bids and estimates. In some embodiments, the system allows for both contractors and consumers to engage as mutually informed parties, while providing images and examples to aid in successful communication. In some embodiments, the system utilizes machine learning to both aid in the generation of a consumer's RFP, and match a consumer with a contractor. In some embodiments, the system employs a suite of tools that allow consumers to specify the specific aspects of their proposal. Non-limiting examples include consumers specifying, building materials, lighting and plumbing fixtures, textiles, design patterns, wall ornaments, cabinetry, electrical work, plumbing, flooring, paint, aesthetic styles, quality of construction, timing constraints, payment preferences and contract terms. In some embodiments, the system allows contractors to review all aspects of a consumer's RFP and submit well-informed bids and/or counteroffers. In some embodiments, a contractor can assess its competitive positioning within the market by reviewing bid results to an RFP that has already been awarded and closed. In some embodiments, a contractor can adjust his or her pending bid upon a physical review of the existing project conditions. In some embodiments, by enabling clear and transparent communications between consumers and contractors, the parties can be matched with minimal transaction costs to provide optimal partnerships.

In some embodiments, the system provides an additional benefit to consumers with little experience in renovation and design. Novice home improvement consumers may not consciously know what particular aspects of home design appeal to them specifically. In some embodiments, the system allows the user to review images of home designs and identify appealing images. Further, the system, in some embodiments, allows the user to identify the features within the images that appeal to the user. In this way, the system allows the consumer, in some embodiments, to identify their own likes and dislikes, and enables the consumer to match their preferences with previously unknown cost estimate reference points. Once the consumer understands his or her own preferences and the associated costs, efficient communication with a contractor is possible. The system therefore, in some embodiments, lowers the transaction costs for both consumer and contractor, the savings of which can be distributed amongst both parties.

The computer implemented systems, methods and software described herein enables consumers and contractors engage with one another on a mutually informed and transparent basis. The disclosure serves to fix the home improvement industry by providing clarity and market efficiency for both homeowners and contractors. The systems, methods and software disclosed herein apply deep construction domain experience, and employs machine learning, to empower home owners to initiate and complete their projects with total clarity and confidence. The systems, methods and software disclosed herein service contractors by providing an intelligent and intuitive bid platform to efficiently prepare and submit cost proposals for consumer-defined projects.

One aspect, disclosed herein is a computer-implemented system comprising: a digital processing device comprising: at least one processor, an operating system configured to perform executable instructions, a memory, and a computer program including instructions executable by the digital processing device to create a digital request for proposal application comprising: a) a software module that displays a collection of regions, wherein each comprises a plurality of independently selectable sub-regions; b) a software module that receives a data set from a user and generates a user data profile, wherein the data set comprises at least one selected sub-region; c) a behavior and demographics learning engine that applies a first machine learning algorithm to generate a property construction cost plan based on data comprising the user data profile; d) a cost learning engine that applies a second machine learning algorithm to generate a dynamic cost estimate for the property construction cost plan based on data comprising the user data profile; and e) a software module that generates a digital request for proposal based on the property construction cost plan and the cost estimate. Optionally in some embodiments, the data set comprises Internet Protocol address, zip code data, geographical data, property address, a user click stream, a user's budget for a property construction project, a user's scope of a property construction project, a room specification, a user's quality preference, a project specification, or selected design elements. Optionally in some embodiments, the user data profile comprises a user's intent, a user's quality sensibilities, a user's design sensibilities, a user's material preferences, a user's looks preferences, a user's budget, a property type, a property age, a room specification by type, or level of attention to detail. Optionally in some embodiments, the property construction cost plan comprises a visual summary of the property construction plan, a cost breakdown of each aspect of the property construction plan, a Styleboard, or a pie chart. Optionally in some embodiments, the system further comprises a software module that receives a data set from a non-user. Optionally in some embodiments, the system further comprises a software module that accepts the data set from a non-user and feeds back the non-user data set to the behavior and demographics learning engine to improve the generation of property construction cost plans over time. Optionally in some embodiments, the property construction cost plan comprises a plurality of adjustable parameters. Optionally in some embodiments, the system further comprises a software module that accepts user data profiles and feeds back the user data profiles to the behavior and demographics learning engine to improve the generation of property construction cost plans over time. Optionally in some embodiments, the system further comprises a software module that accepts verified data regarding cost for an actual property construction project plan to the cost learning engine to improve its estimation of costs for working property construction project plans over time. Optionally in some embodiments, the cost learning engine comprises an index engine, a quantity engine, and a rules engine. Optionally in some embodiments, the index engine comprises a categorical cost of index adjustment by zip code and hierarchical cost data. Optionally in some embodiments, the quantity engine comprises a quantity manager comprising tethered quantity rules, overage rules, project quality adjustments rules, home area adjustment rules, home type, age, or room specification adjustment rules. Optionally in some embodiments, the rules engine comprises extensible rule set comprising scenario exclusions, attributes inheritance, scope tethering, reverse tethering, default scope selection by project quality, default scope selection by budget, default scope plan by project scale, or default scope plan by budget. Optionally in some embodiments, verified data is acquired from actual bids for actual property constructional projects from contractors. Optionally in some embodiments, the system further comprises: a) a software module that receives a digital request for proposal from a user of a first device; b) a software module that receives data input from a plurality of users from a non-first device; c) a matching engine that applies a third machine learning algorithm to match one or non-first device users based data comprising the digital request for proposal; d) a software module that submits the digital request for proposal to the matched non-first device users as a bid; and e) a software module that accepts verified data regarding outcomes of past property construction projects to the matching engine to improve its matching over time. Optionally in some embodiments, the non-first device users comprise service providers. Optionally in some embodiments, the matching engine comprises a scoring analysis, a thresholding analysis, and a scheduler analysis. Optionally in some embodiments, the scoring analysis comprises an analysis based on project expertise requirements, quality craftsmanship, project scale, service area, service provider ratings, activity score, bid response score, service provider booking, and service provider schedule. Optionally in some embodiments, the scheduler analysis comprises an analysis based on the speed of bid submissions over time or changes in the matching algorithm. Optionally in some embodiments, the system further comprises a state machine schedule module that notifies the user and the non-first device users of a status of the bid.

Another aspect, disclosed herein is a non-transitory computer-readable storage media encoded with a computer program including instructions executable by a processor to create a digital request for proposal application comprising: a) a software module that displays a collection of regions, wherein each comprises a plurality of independently selectable sub-regions; b) a software module that receives a data set from a user and generates a user data profile, wherein the data set comprises at least one selected sub-region; c) a behavior and demographics learning engine that applies a first machine learning algorithm to generate a property construction cost plan based on data comprising the user data profile; d) a cost learning engine that applies a second machine learning algorithm to generate a dynamic cost estimate for the property construction cost plan based on data comprising the user data profile; and e) a software module that generates a digital request for proposal based on the property construction cost plan and the cost estimate. Optionally in some embodiments, the media further comprises a software module that accepts user data profiles and feeds back the user data profiles to the behavior and demographics learning engine to improve the generation of property construction cost plans over time. Optionally in some embodiments, the media further comprises a software module that accepts verified data regarding cost for an actual property construction project plan to the cost learning engine to improve its estimation of costs for working property construction project plans over time. Optionally in some embodiments, the media further comprises: a) a software module that receives a digital request for proposal from a user of a first device; b) a software module that receives data input from a plurality of users from a non-first device; c) a matching engine that applies a third machine learning algorithm to match one or non-first device users based data comprising the digital request for proposal; d) a software module that submits the digital request for proposal to the matched non-first device users as a bid; and e) a software module that accepts verified data regarding outcomes of past property construction projects to the matching engine to improve its matching over time.

Another aspect, disclosed herein is a computer-implemented method for creating a digital request for proposal comprising: a) providing, in a computer storage, a collection of regions, wherein each comprises a plurality of independently selectable sub-regions; b) receiving, by a computer, a data set from a user and generates a user data profile, wherein the data set comprises at least one selected sub-region; c) applying, by the computer, a first machine learning algorithm by a behavior and demographics learning engine to generate a property construction cost plan based on data comprising the user data profile; d) applying, by the computer, a second machine learning algorithm by a cost learning engine to generate a dynamic cost estimate for the property construction cost plan based on data comprising the user data profile; and e) generating, by the computer, a digital request for proposal based on the property construction cost plan and the cost estimate. Optionally in some embodiments, the method further comprises a software module that accepts user data profiles and feeds back the user data profiles to the behavior and demographics learning engine to improve the generation of property construction cost plans over time. Optionally in some embodiments, the method further comprises a software module that accepts verified data regarding cost for an actual property construction project plan to the cost learning engine to improve its estimation of costs for working property construction project plans over time.

BRIEF DESCRIPTION OF THE DRAWINGS

The novel features of the disclosure are set forth with particularity in the appended claims. A better understanding of the features and advantages of the present disclosure will be obtained by reference to the following detailed description that sets forth illustrative embodiments, in which the principles of the disclosure are utilized, and the accompanying drawings of which:

DETAILED DESCRIPTION OF THE INVENTION

Figure 1:
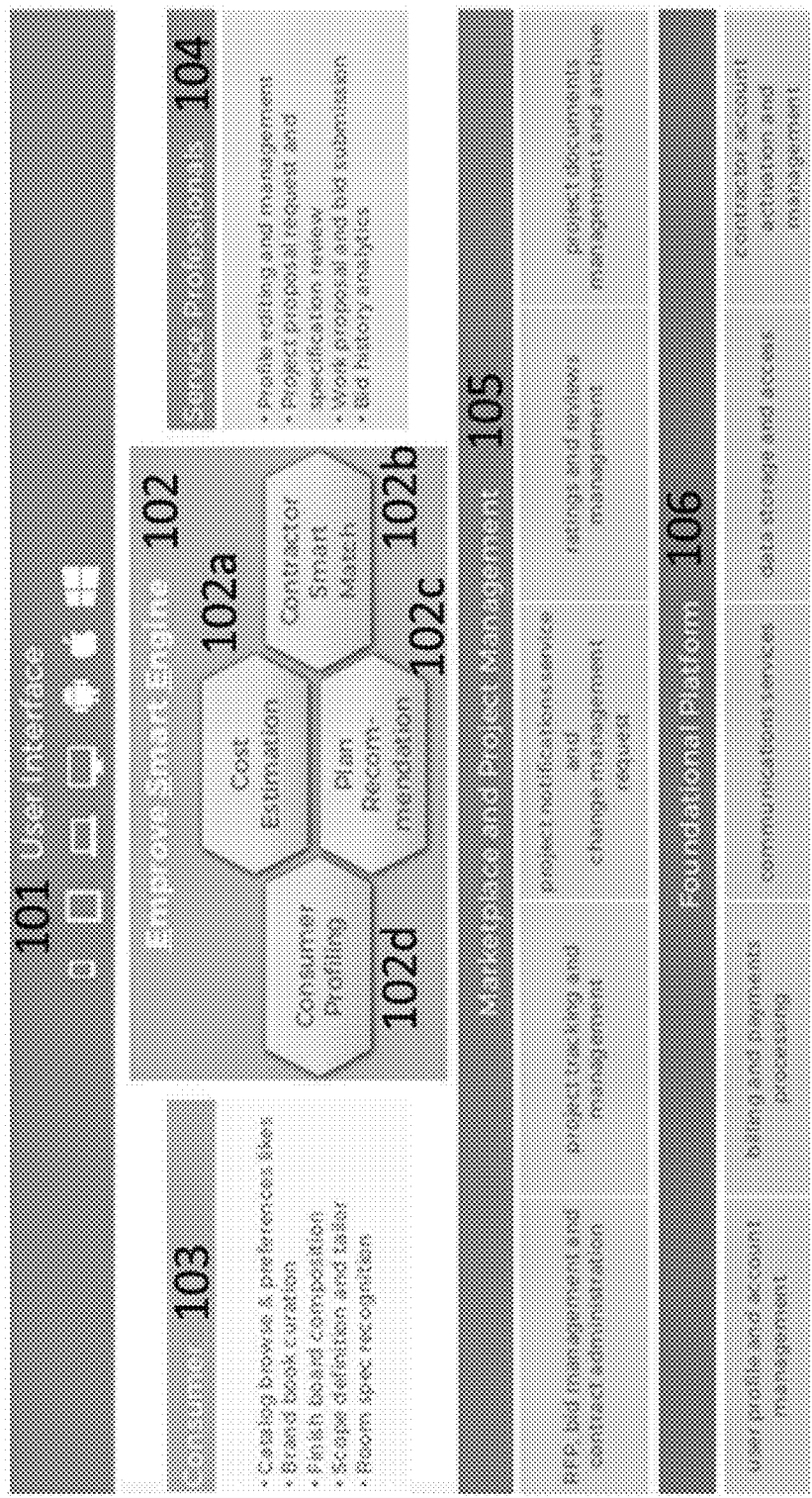
FIG. 1 shows; a non-limiting example of a diagram; in this case, a diagram illustrating the features of the computer-implemented system disclosed herein.

Disclosed herein is a computer-implemented system comprising: a digital processing device comprising: at least one processor, an operating system configured to perform executable instructions, a memory, and a computer program including instructions executable by the digital processing device to create a digital request for proposal application comprising: a) a software module that displays a collection of regions, wherein each comprises a plurality of independently selectable sub-regions; b) a software module that receives a data set from a user and generates a user data profile, wherein the data set comprises at least one selected sub-region; c) a behavior and demographics learning engine that applies a first machine learning algorithm to generate a property construction cost plan based on data comprising the user data profile; d) a cost learning engine that applies a second machine learning algorithm to generate a dynamic cost estimate for the property construction cost plan based on data comprising the user data profile; and e) a software module that generates a digital request for proposal based on the property construction cost plan and the cost estimate. Optionally in some embodiments, the data set comprises Internet Protocol address, zip code data, geographical data, property address, a user click stream, a user's budget for a property construction project, a user's scope of a property construction project, a room specification, a user's quality preference, a project specification, or selected design elements. Optionally in some embodiments, the user data profile comprises a user's intent, a user's quality sensibilities, a user's design sensibilities, a user's material preferences, a user's looks preferences, a user's budget, a property type, a property age, a room specification by type, or level of attention to detail. Optionally in some embodiments, the property construction cost plan comprises a visual summary of the property construction plan, a cost breakdown of each aspect of the property construction plan, a Styleboard, or a pie chart. Optionally in some embodiments, the system further comprises a software module that receives a data set from a non-user. Optionally in some embodiments, the system further comprises a software module that accepts the data set from a non-user and feeds back the non-user data set to the behavior and demographics learning engine to improve the generation of property construction cost plans over time. Optionally in some embodiments, the property construction cost plan comprises a plurality of adjustable parameters. Optionally in some embodiments, the system further comprises a software module that accepts user data profiles and feeds back the user data profiles to the behavior and demographics learning engine to improve the generation of property construction cost plans over time. Optionally in some embodiments, the system further comprises a software module that accepts verified data regarding cost for an actual property construction project plan to the cost learning engine to improve its estimation of costs for working property construction project plans over time. Optionally in some embodiments, the cost learning engine comprises an index engine, a quantity engine, and a rules engine. Optionally in some embodiments, the index engine comprises a categorical cost of index adjustment by zip code and hierarchical cost data. Optionally in some embodiments, the quantity engine comprises a quantity manager comprising tethered quantity rules, overage rules, project quality adjustments rules, home area adjustment rules, home type, age, or room specification adjustment rules. Optionally in some embodiments, the rules engine comprises extensible rule set comprising scenario exclusions, attributes inheritance, scope tethering, reverse tethering, default scope selection by project quality, default scope selection by budget, default scope plan by project scale, or default scope plan by budget. Optionally in some embodiments, verified data is acquired from actual bids for actual property constructional projects from contractors. Optionally in some embodiments, the system further comprises: a) a software module that receives a digital request for proposal from a user of a first device; b) a software module that receives data input from a plurality of users from a non-first device; c) a matching engine that applies a third machine learning algorithm to match one or non-first device users based data comprising the digital request for proposal; d) a software module that submits the digital request for proposal to the matched non-first device users as a bid; and e) a software module that accepts verified data regarding outcomes of past property construction projects to the matching engine to improve its matching over time. Optionally in some embodiments, the non-first device users comprise service providers. Optionally in some embodiments, the matching engine comprises a scoring analysis, a thresholding analysis, and a scheduler analysis. Optionally in some embodiments, the scoring analysis comprises an analysis based on project expertise requirements, quality craftsmanship, project scale, service area, service provider ratings, activity score, bid response score, service provider booking, and service provider schedule. Optionally in some embodiments, the scheduler analysis comprises an analysis based on the speed of bid submissions over time or changes in the matching algorithm. Optionally in some embodiments, the system further comprises a state machine schedule module that notifies the user and the non-first device users of a status of the bid.

Disclosed herein is a non-transitory computer-readable storage media encoded with a computer program including instructions executable by a processor to create a digital request for proposal application comprising: a) a software module that displays a collection of regions, wherein each comprises a plurality of independently selectable sub-regions; b) a software module that receives a data set from a user and generates a user data profile, wherein the data set comprises at least one selected sub-region; c) a behavior and demographics learning engine that applies a first machine learning algorithm to generate a property construction cost plan based on data comprising the user data profile; d) a cost learning engine that applies a second machine learning algorithm to generate a dynamic cost estimate for the property construction cost plan based on data comprising the user data profile; and e) a software module that generates a digital request for proposal based on the property construction cost plan and the cost estimate. Optionally in some embodiments, the media further comprises a software module that accepts user data profiles and feeds back the user data profiles to the behavior and demographics learning engine to improve the generation of property construction cost plans over time. Optionally in some embodiments, the media further comprises a software module that accepts verified data regarding cost for an actual property construction project plan to the cost learning engine to improve its estimation of costs for working property construction project plans over time. Optionally in some embodiments, the media further comprises: a) a software module that receives a digital request for proposal from a user of a first device; b) a software module that receives data input from a plurality of users from a non-first device; c) a matching engine that applies a third machine learning algorithm to match one or non-first device users based data comprising the digital request for proposal; d) a software module that submits the digital request for proposal to the matched non-first device users as a bid; and e) a software module that accepts verified data regarding outcomes of past property construction projects to the matching engine to improve its matching over time.

Disclosed herein is a computer-implemented method for creating a digital request for proposal comprising: a) providing, in a computer storage, a collection of regions, wherein each comprises a plurality of independently selectable sub-regions; b) receiving, by a computer, a data set from a user and generates a user data profile, wherein the data set comprises at least one selected sub-region; c) applying, by the computer, a first machine learning algorithm by a behavior and demographics learning engine to generate a property construction cost plan based on data comprising the user data profile; d) applying, by the computer, a second machine learning algorithm by a cost learning engine to generate a dynamic cost estimate for the property construction cost plan based on data comprising the user data profile; and e) generating, by the computer, a digital request for proposal based on the property construction cost plan and the cost estimate. Optionally in some embodiments, the method further comprises a software module that accepts user data profiles and feeds back the user data profiles to the behavior and demographics learning engine to improve the generation of property construction cost plans over time. Optionally in some embodiments, the method further comprises a software module that accepts verified data regarding cost for an actual property construction project plan to the cost learning engine to improve its estimation of costs for working property construction project plans over time.

The consumer data is processed using machine learning algorithms to generate a digital request for proposal (RFP). The RFP provides contractors the information necessary to calculate costs and provide bids to the consumer, creating a marketplace.

An overview of an exemplary system is provided as a non-limiting example in FIG. 1. In some embodiments, the user interface is available across computing platforms, including but not limited to mobile devices, smartphone devices, tablet devices, laptop devices, and desktop devices utilizing Android, Apple, and Windows operating systems (101). Machine learning algorithms (102) are used to determine the profile of the consumer (102*a*), the cost estimate for a consumer's desired project (102*b*), recommendations to help the consumer reach their goals (102*c*), and matches between a consumers and contractors (102*d*). The system comprises an application, of which both consumers and contractors engage with to communicate their preferences. In some embodiments, the application is a web based application. In some embodiments, the application is a mobile application. In some embodiments, the application is a stand-alone application. In some embodiments, the application is a browser plug in. (103) shows various functionalities included in the application for the consumers benefit, including, but not limited to, the ability to browse a catalogue of home design images, select preferences within the catalogue, assemble preferences into a book for curation, compose a Styleboard of images comprising a user's favored preferences, and input room specifications. Item 104 displays the functionalities available to contractors and service professionals, including but not limited to, contractor profile editing and management, a dashboard for reviewing consumer RFPs and specifications, a work proposal and bid submission system, and bid history analytics. The system also comprises a marketplace and project management component (105) and a foundational platform component (106). The marketplace and project management component allows the parties to communicate and comprises functionalities for RFP bid management, contract administration, project tracking and management, project notification services and change management requests, ratings and reviews management, project documents management and archiving. The foundational platform component is used by the authoring party and comprises functionalities for user profile and account management, billing and payment processing, communications services, data storage and access, and contractor account activation and management.

Figure 2:
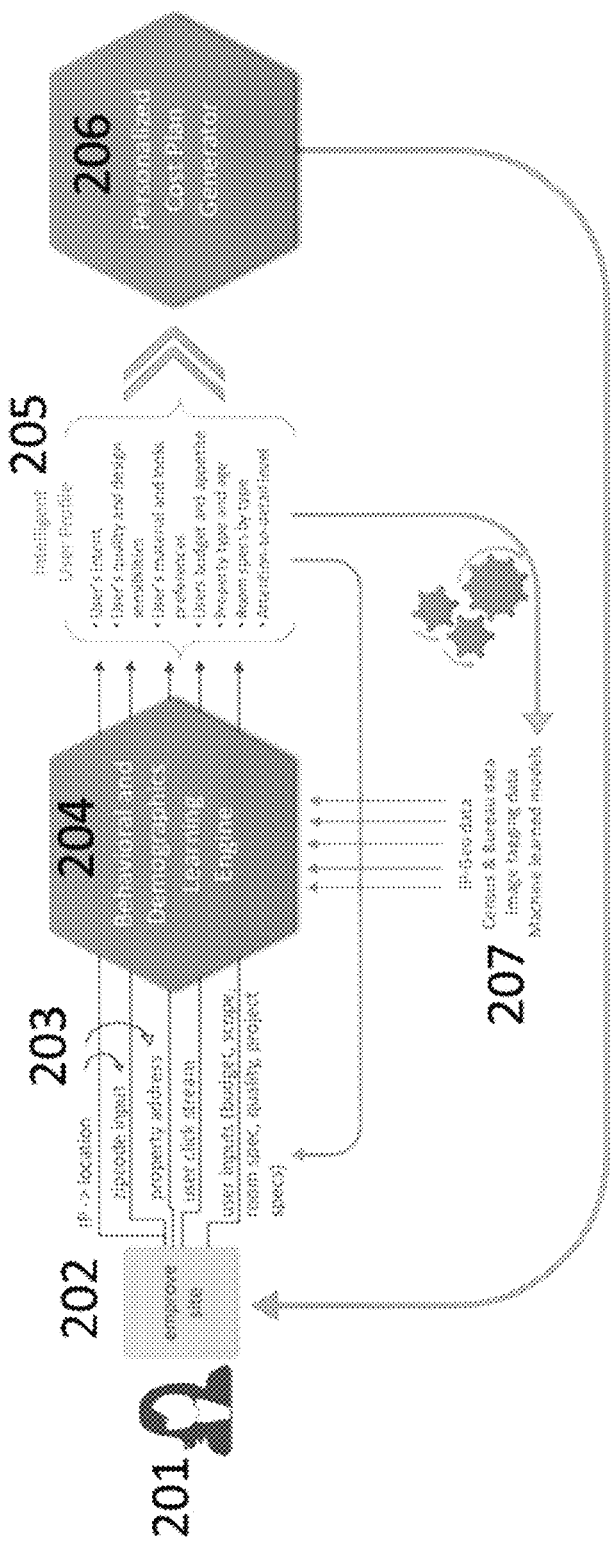
FIG. 2 shows a non-limiting example of a diagram; in this case, a diagram illustrating the interaction between the data collected from the user and the machine learning algorithm used to generate a cost estimate for a proposed project.

In some embodiments, FIG. 2 shows an exemplary embodiment of the interaction between the data collected from the user and the machine learning algorithm used to generate a cost estimate for a proposed project. The consumer or user (201) interacts with the computer-implemented system through use of the application (202). Data is collected from the user through the application. The data optionally comprises the user's computer location (IP address), the zip code provided by the user, the property address provided by the user, the users clickstream, any selection made by the user on the website (non-limiting examples include budget, scope, room specifications, quality, project specification), or any combination thereof (203). The data is processed using the behavioral and demographics machine learning engine (204), which outputs an intelligent user profile (205). The intelligent user profile may include data relating to the use's intent, the user's quality and design sensibilities, the user's material and looks preferences, the user's budget and appetite, the property type and age, the room specifications and type, and the user's attention to detail level. The intelligent user profile is optionally added to the user data (203), or supplemented with additional third party data (207) and reprocessed using the behavioral and demographics machine learning engine (204). Said additional third party data may include, but is not limited to, IP address geographic data, census and bureau data, image tagging data, and machine learning methods. The intelligent user profile is then processed using the personalized cost plan generator to generate a cost estimate for the use's proposed plan.

Figure 3:
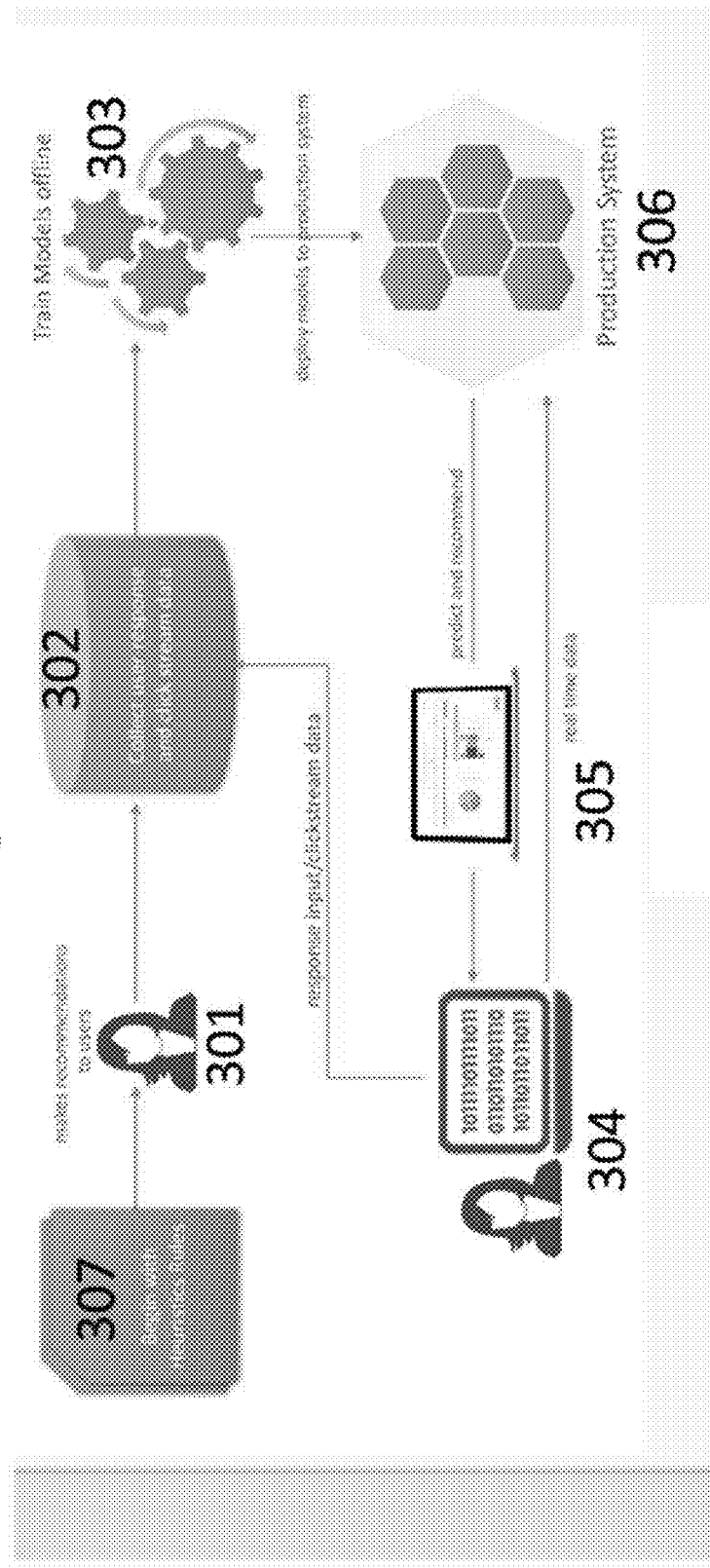
FIG. 3 shows a non-limiting example of a diagram; in this case, a diagram illustrating machine learning process employed in the computer-implemented systems disclosed herein.

An exemplary embodiment of a machine learning process is depicted in FIG. 3. Training begins with the generation of heuristic rules (301) that are used to generate recommendations to the user (302). The users-response and clickstream data are collected (303) and used to train model algorithms offline (304). The models are then deployed to the production system (307), which is then used to make refined recommendations (305) to the user. The response input and clickstream data (303) is used for further model training, as well as being transmitted in real time (306) to the production system for use in generating additional predictions and recommendations.

Generating the cost of a user's project is a non-trivial aspect of the disclosure. Traditionally contractors use experience and reasoning to analyze and weigh various aspects of a project to arrive at a bid. This may require that the contractor take into account material costs, material availability, current and future labor costs, travel costs, the consumer's preference, logistical hurdles, time restraints, current projects, consumer affluence, profit targets, or any number of additional factors. Replicating this process in a computer-implemented system is non-obvious and critical for the implementation of the application disclosed herein.

Figure 4:
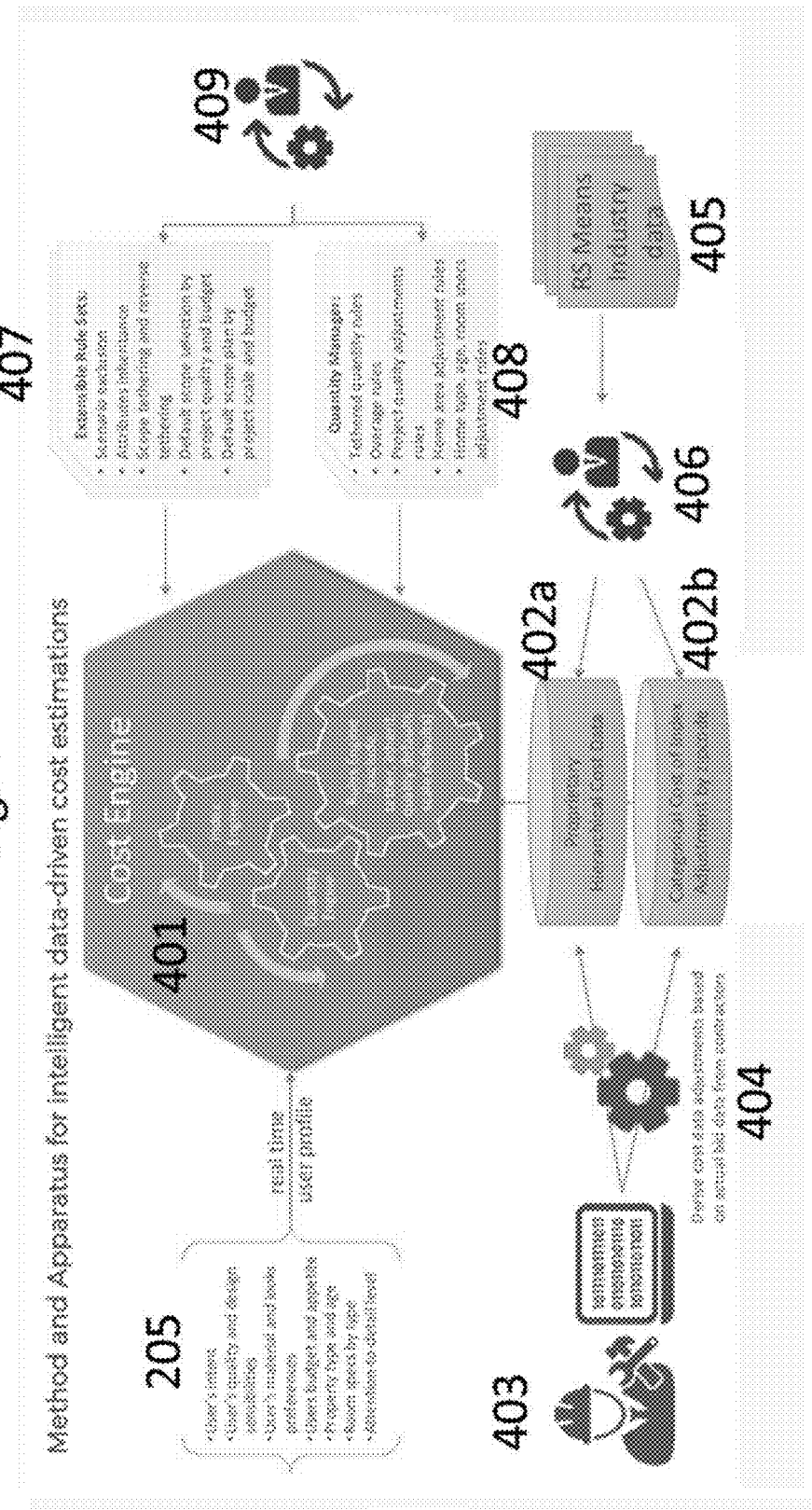
FIG. 4 shows a non-limiting example of a diagram; in this case, a diagram illustrating the cost engine used to generate cost estimates for user proposed projects.

In some embodiments, FIG. 4 depicts an exemplary embodiment of a cost engine used to generate cost estimates for user proposed projects. Data provided by the user's intelligent user profile (205) is one of many data sets submitted to the cost engine for processing. Additional data sets include hierarchical data costs (402*a*) and costs adjustment by zip code (402*b*). Hierarchical data and zip code data adjustment factors are calculated from contractor data (403), current and past bids from contractors (404), construction industry data (405), and data processing techniques (406). The data sets are processed according to rules (407 and 408) authored and controlled by the system authors.

Figure 5:
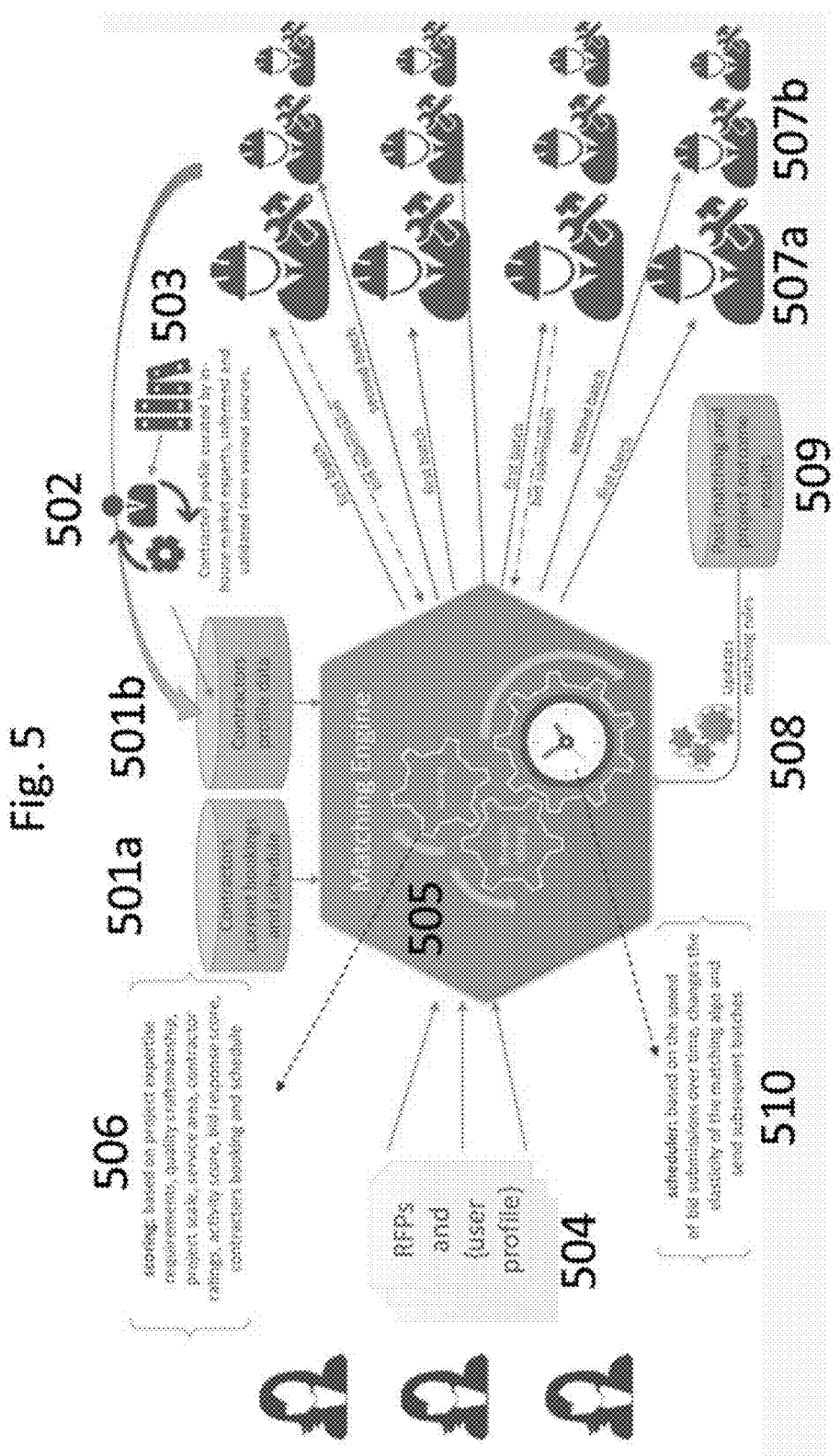
FIG. 5 shows a non-limiting example of a diagram; in this case, a diagram illustrating the matchmaking process used to match consumers and contractors.
Figure 6:
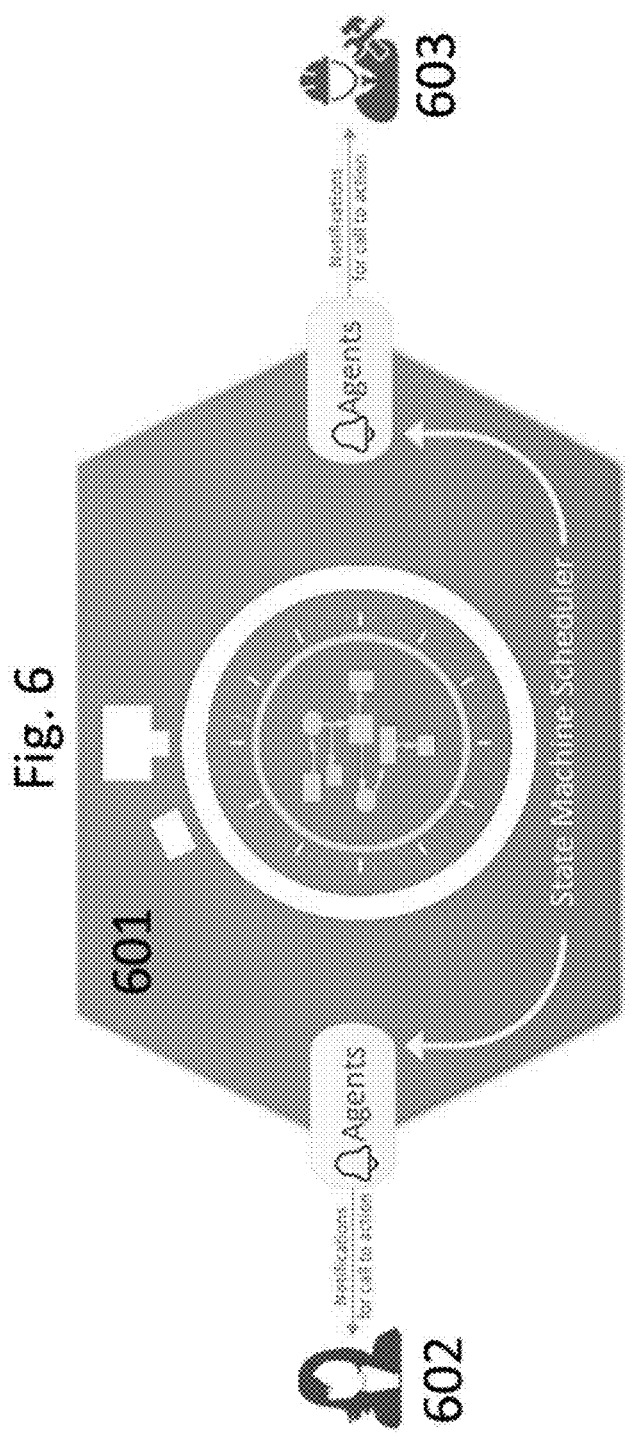
FIG. 6 shows a non-limiting example of a diagram; in this case, a diagram illustrating the scheduling platform used to communicate notifications on the progress of the bidding process.

In some embodiments, the computer implemented system disclosed herein matches a consumer and the consumers associated RFP with possible contractors. Matching a consumer with an ideal contractor is also non-trivial and traditionally requires large investments of time, effort and resources from both the consumer and the contractor. Replicating the matchmaking process within the computer-implemented system is non-obvious and constitutes a significant advance. The matchmaking process is depicted in FIG. 5 and relies on data and algorithmic input from consumers, contractors, and system authors. Data concerning the contractor's current and future availability (501*a*) and contractor profile data (501*b*) submitted to the matching engine. The contractor profile comprises data inputted by the contractor (502) and is checked for veracity using external sources (503). The consumer profile and RFP data (504) is also processed by the matching engine (505) to yield notifications sent to contractors about possible matches. A first batch of notifications is sent to contractors with high matchmaking scores (506). The first batch contractors (507*a*) have a limited time to submit bids in response to the matchmaking notice. The quality and number of bids is evaluated by the matching engine, and additional rounds of notifications may be sent to contractors with lower matchmaking scores in a second batch of notifications (507*b*). Matchmaking scores may be based on factors such as expertise requirements, quality of craftsmanship, project scale, service area, contractor rating, activity score, bid response time, or contractor availability. The algorithms and rules governing the matching engine can be updated by a machine learning algorithm (508) taking into account past matching results and project outcomes (509). The matching engine allows both parties to view a scheduling platform (510), depicted in FIG. 6. The state machine scheduler (601) provides notifications to both consumers (602) and contractors (603) on advancements through the process. For example, a consumer might receive a notification that their RFP is being reviewed by contractors or has received bids.

Figure 7:
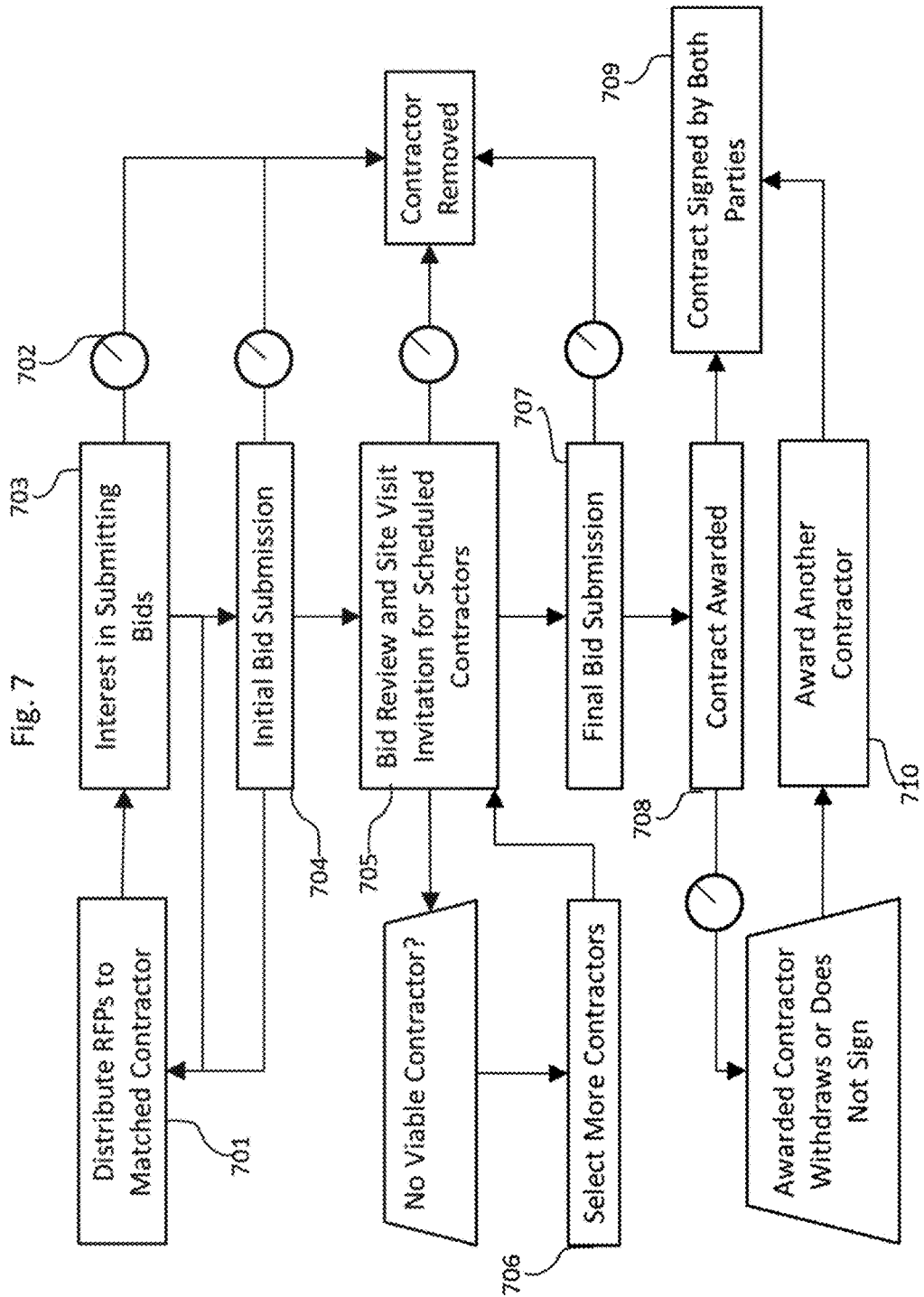
FIG. 7 shows a non-limiting example of a diagram; in this case, a diagram illustrating depicts the process by which RFPs are matched with potential contractors and the process leading to contract formation.

In some embodiments, FIG. 7 depicts the process by which RFPs are matched with potential contractors and the process leading to contract formation. The matching engine determines match scores between an RFP and a pool of contractors. The matching engine distributes the RFPs to the match contractors (701) with the highest scores. A timer (702) is used to track the time between a contractor receiving the RFP and taking an action regarding the RFP. If the time exceeds a preset expiration time, or the contractor indicates that he or she is not interested in the RFP, the RFP is distributed to additional matched contractors. The contractor can also indicate interest in submitting a bid (703). A time is used to track the time allowed for the contractor to submit a bid. If the time expires, the RFP is distributed to additional matched contractors. If a contractor submits a bid on the RFP (704), the bid is reviewed by the consumer (705). In some embodiments the consumer has multiple bids and can select bids to review separately. The consumer may choose to invite any number of contractors for a site visit and evaluation, decline a contractor's bid, or request a final bid submission. If a contractor is declined, the consumer can request additional contractor bids (706). A contractor who receives a request for a site invitation or final bid submission can submit a final bid (707) for the customers review. Again, timers record (702) when parties fail to act in a timely fashion and can trigger the distribution of the RFP to additionally matched contractors. If the consumer accepts a contractor's final bid submission (708), the contract is awarded and signed by both parties (709). If signatures are withheld or the contractor withdraws, the consumer is free to award the job to another contractor (710).

Consumer Generation of RFP

In some embodiments, an RFP is generated by the system using data collected from the system user and the machine learning algorithm. In some embodiments, the data collected from the user comprises the user's computer location (IP address), the zip code provided by the user, the property address provided by the user, the users clickstream, any selection made by the user on the application (non-limiting examples include budget, scope, room specifications, quality, project specification), or any combination thereof.

Figure 8:
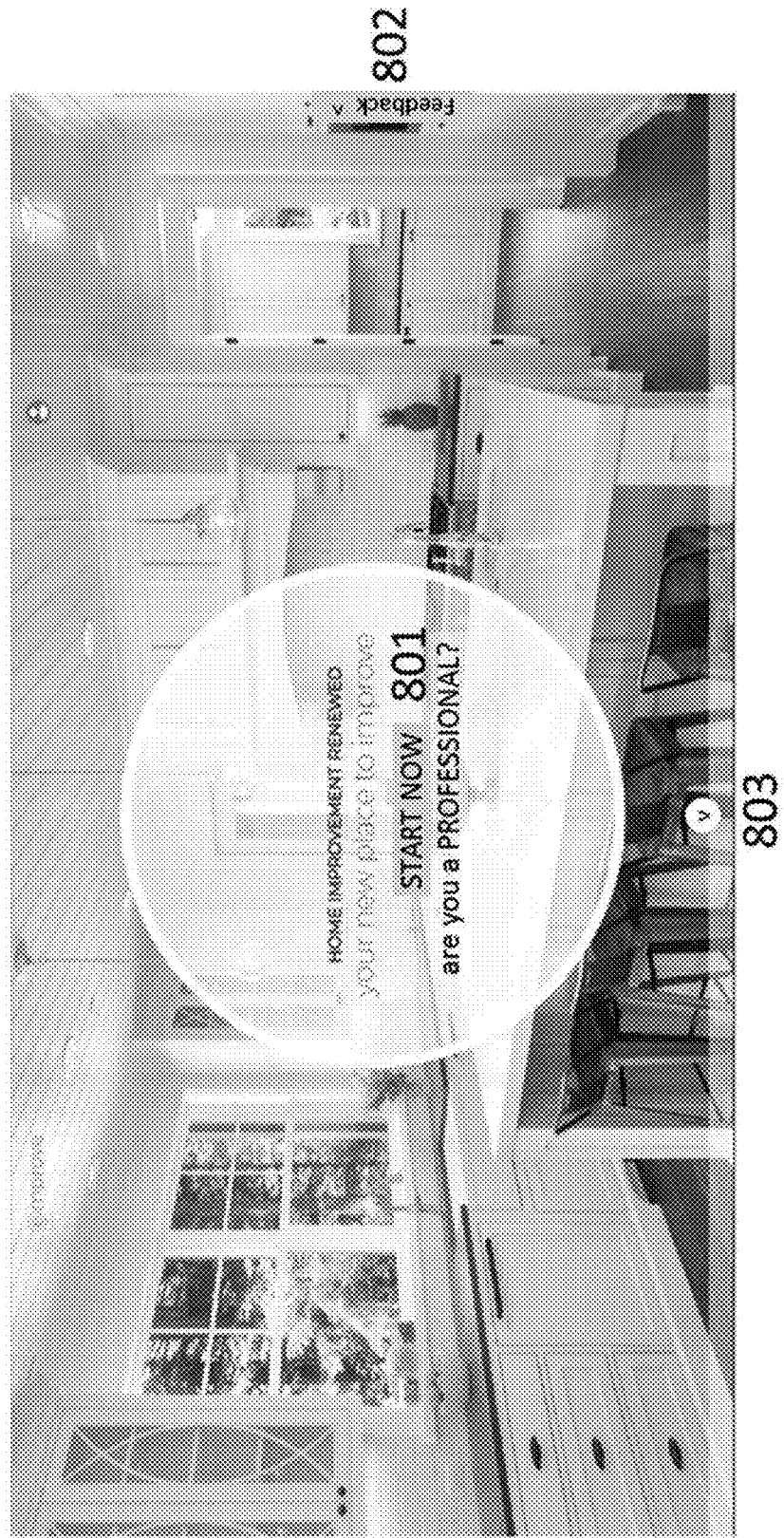
FIG. 8 shows a non-limiting example of a graphical user interface; in this case, a graphic user interface used in an application in order to provide an embodiment of the applications home-page.
Figure 9:
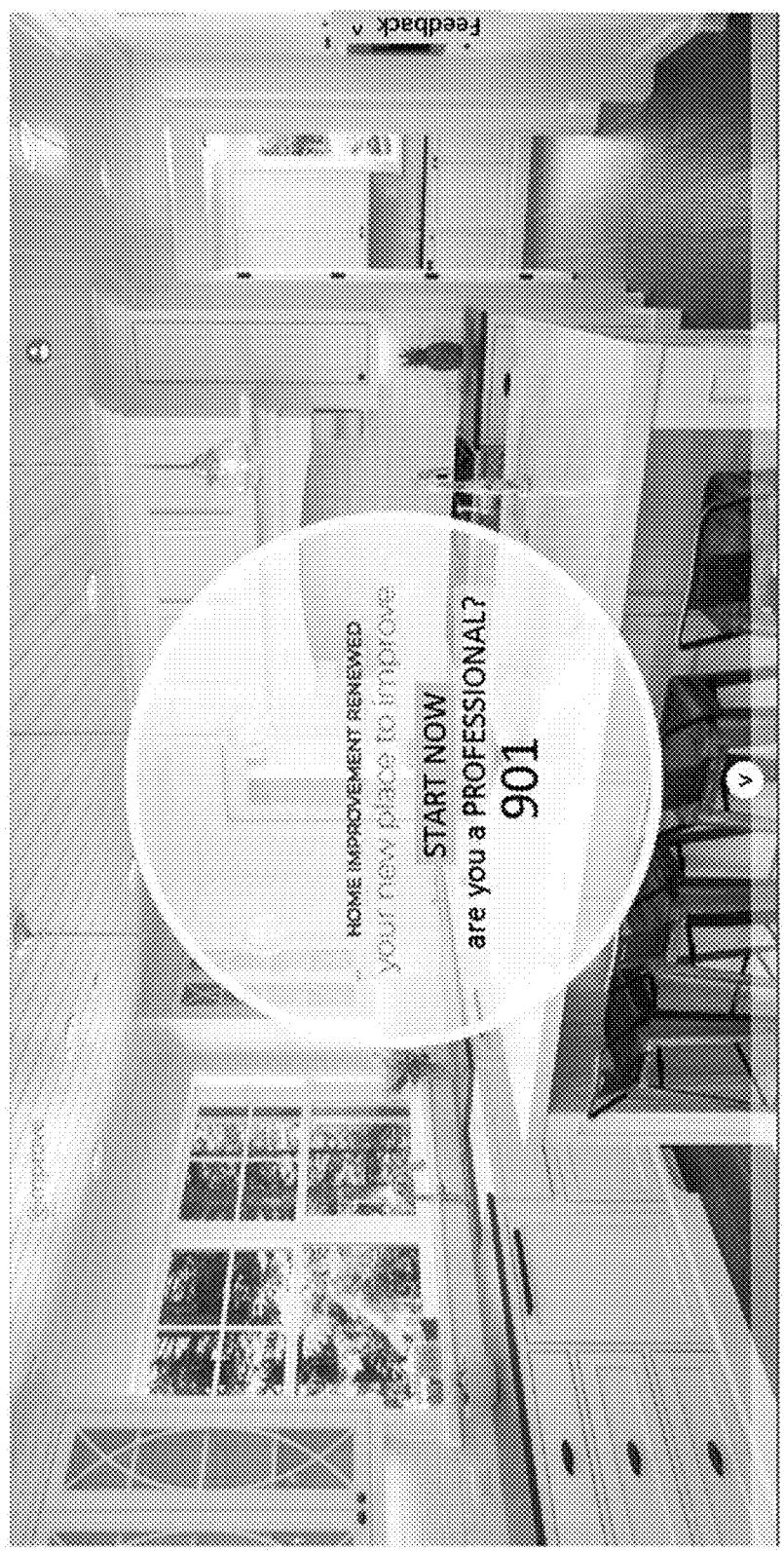
FIG. 9 shows a non-limiting example of a graphical user interface; in this case, a graphic user interface used in an application in order to provide an embodiment of the applications home-page.

Optionally, in some embodiments, generation of the RFP may begin when a user first indicates his or her status as a consumer on the application home page, shown in FIG. 8. Consumers may access the consumer platform to begin or resume RFP generation by selecting the "start now" button (801). If the user would like to leave feedback, 802 can be selected. A tour of the application can be accessed via repeated selection of the down arrow 803. Contractors can access the contractor platform by selecting the "Are you a professional?" button (901) in FIG. 9.

Figure 10:
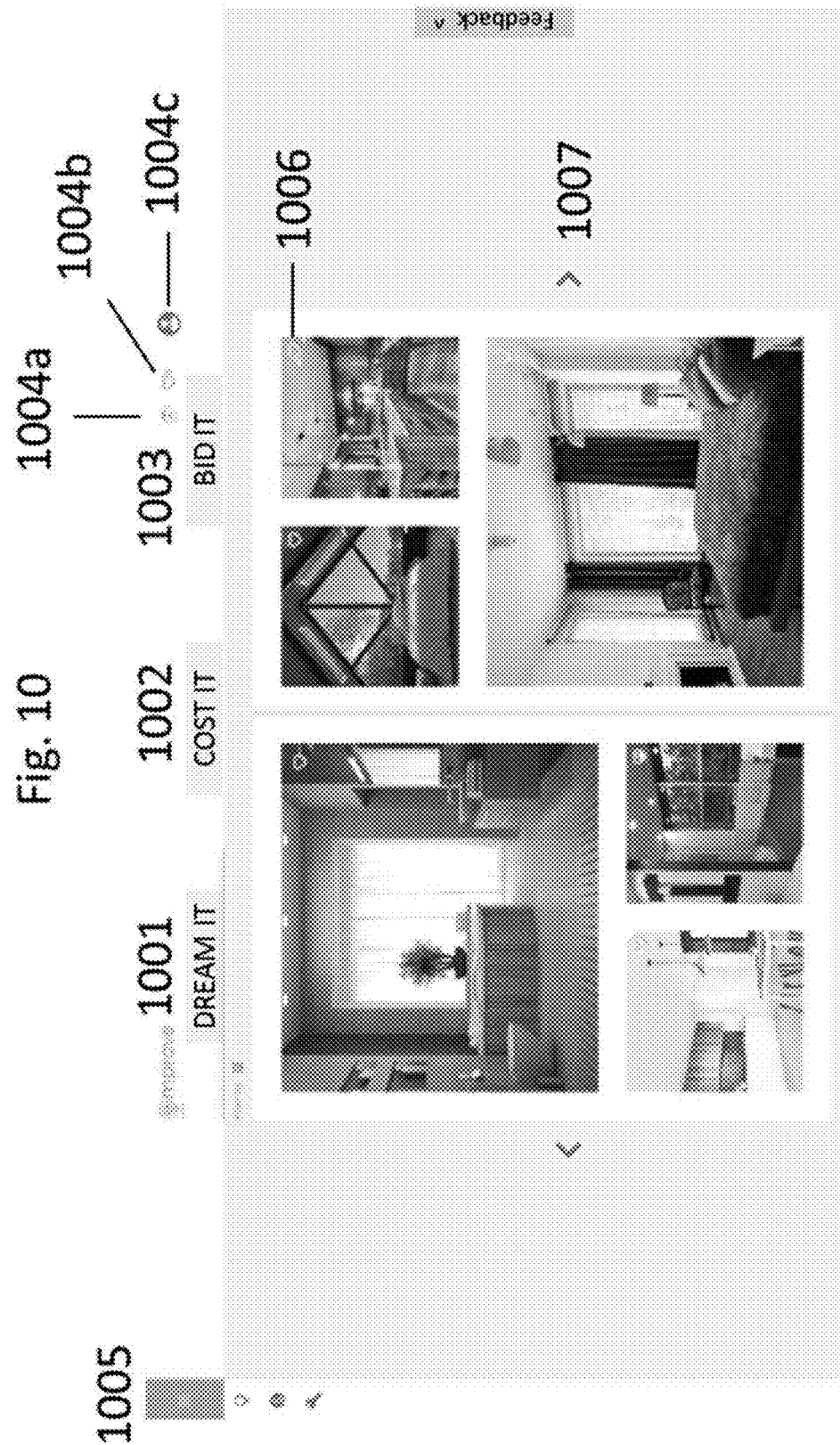
FIG. 10 shows a non-limiting example of a graphical user interface; in this case, a graphic user interface used in an application in order to provide an embodiment depicting the major steps for RFP generation.

In some embodiments, once the consumer platform is selected, the application presents a new graphical user interface with additional functionalities (FIG. 10). In one embodiment, the systems, methods and software disclosed herein employ a process comprising three steps. Non-limiting exemplary titles of said steps are "DREAM IT, COST IT, and BID IT."

In some embodiments, the three primary tabs presented are the "DREAM IT" (1001) tab, the "COST IT" (1002) tab, and the "BID IT" (1003) tab. These functionalities are explained throughout the remaining figures below. In addition, icon 1004a display the users saved projects, icon 1004b displays the number of pictures of items selected as "favorite" or "liked" images, and 1004c indicates the users profile information. Selections 1005 provide additional selections used to navigate the applications features. The primary image field is populated by images of rooms of various designs and styles. A user selects a heart icon (1006) on an image to indicate the user's approval of a particular item within the image. Each time a heart icon is selected, the overall number of selections is recorded in 1004b. To access additional images for approval, the user selects the right facing arrow 1007 to populate the screen with new images of interior or exterior spaces.

DREAM IT

In some embodiments, within the "DREAM IT" step, consumers filter through thousands of design images that have been uniquely organized and labeled by the system author so that the consumer can "like" specific elements of each image, informing the platform with each selection. The platform then presents the consumer with its Styleboard, an interactive visualization tool to visually reconcile the various elements they have "liked" with one another. At the conclusion of this step the platform has comprehensively learned the consumers design sensibilities on a granular scope item level and is now prepared to translate them into a tailored and actionable project scope of work.

Figure 11:
FIG. 11 shows a non-limiting example of a graphical user interface; in this case, a graphic user interface used in an application in order to provide an embodiment of filters available within the application.

In some embodiments, to begin the "DREAM IT" step, a user indicates their own style and preference through the selection and "liking" of the presented catalogue images. Non-limiting examples of the applications "DREAM IT" graphical user interface are seen in FIGS. 10-18. The user can apply a series of filters to display images that are more pertinent to the user's desired goals or to eliminate images that are of little interest to the user. FIG. 11 shows the filter tab 1101, which upon selection displays options to filter images by home area (1102), style (1103) and quality (1104). Multiple categories can be selected, and multiple options within the categories can be selected. All filters applied can be removed.

Figure 12:
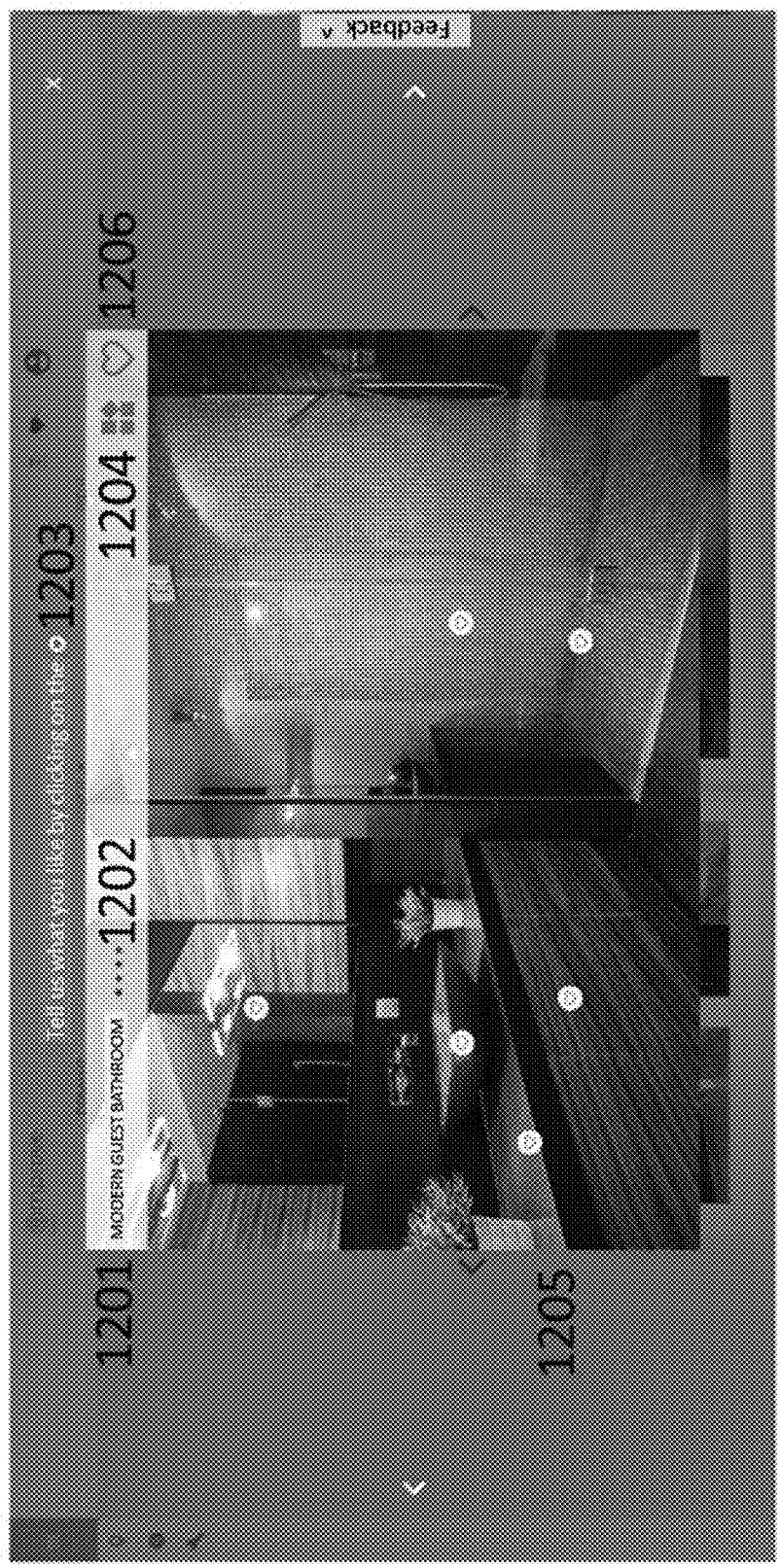
FIG. 12 shows a non-limiting example of a graphical user interface; in this case, a graphic user interface used in an application in order to provide an embodiment of a user's ability to specify preferred images.
Figure 13:
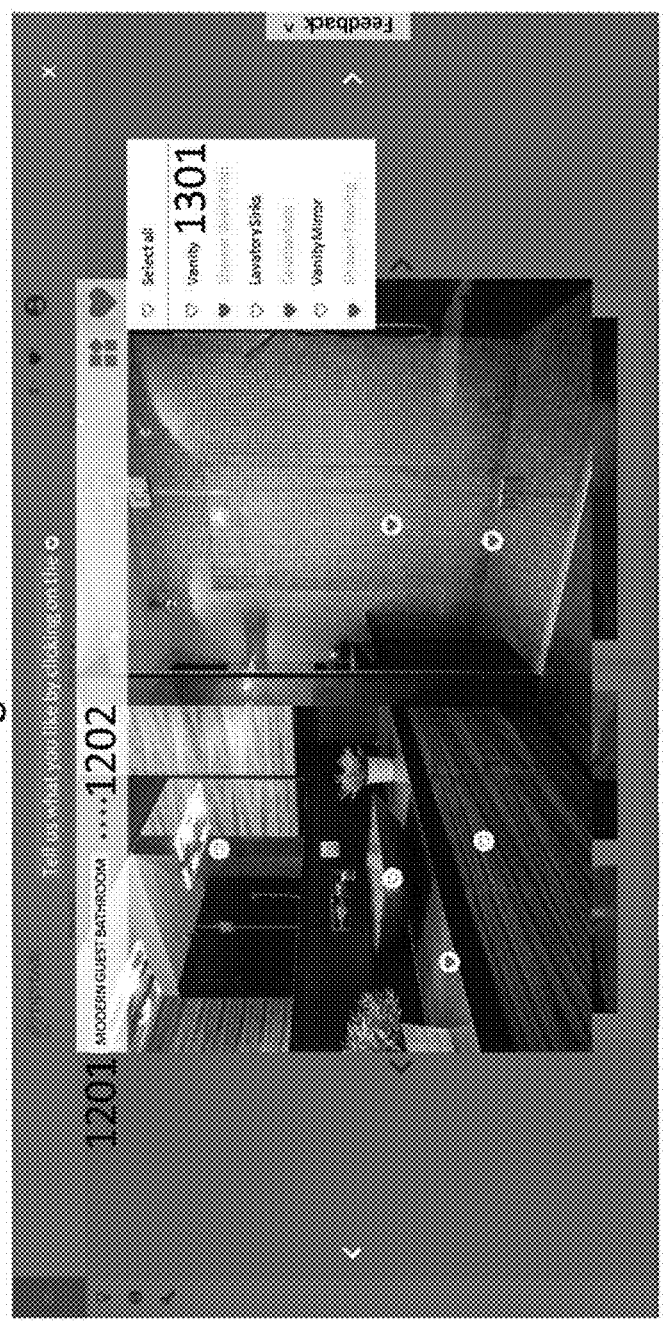
FIG. 13 shows a non-limiting example of a graphical user interface; in this case, a graphic user interface used in an application in order to provide an embodiment of drop down menus.
Figure 14:
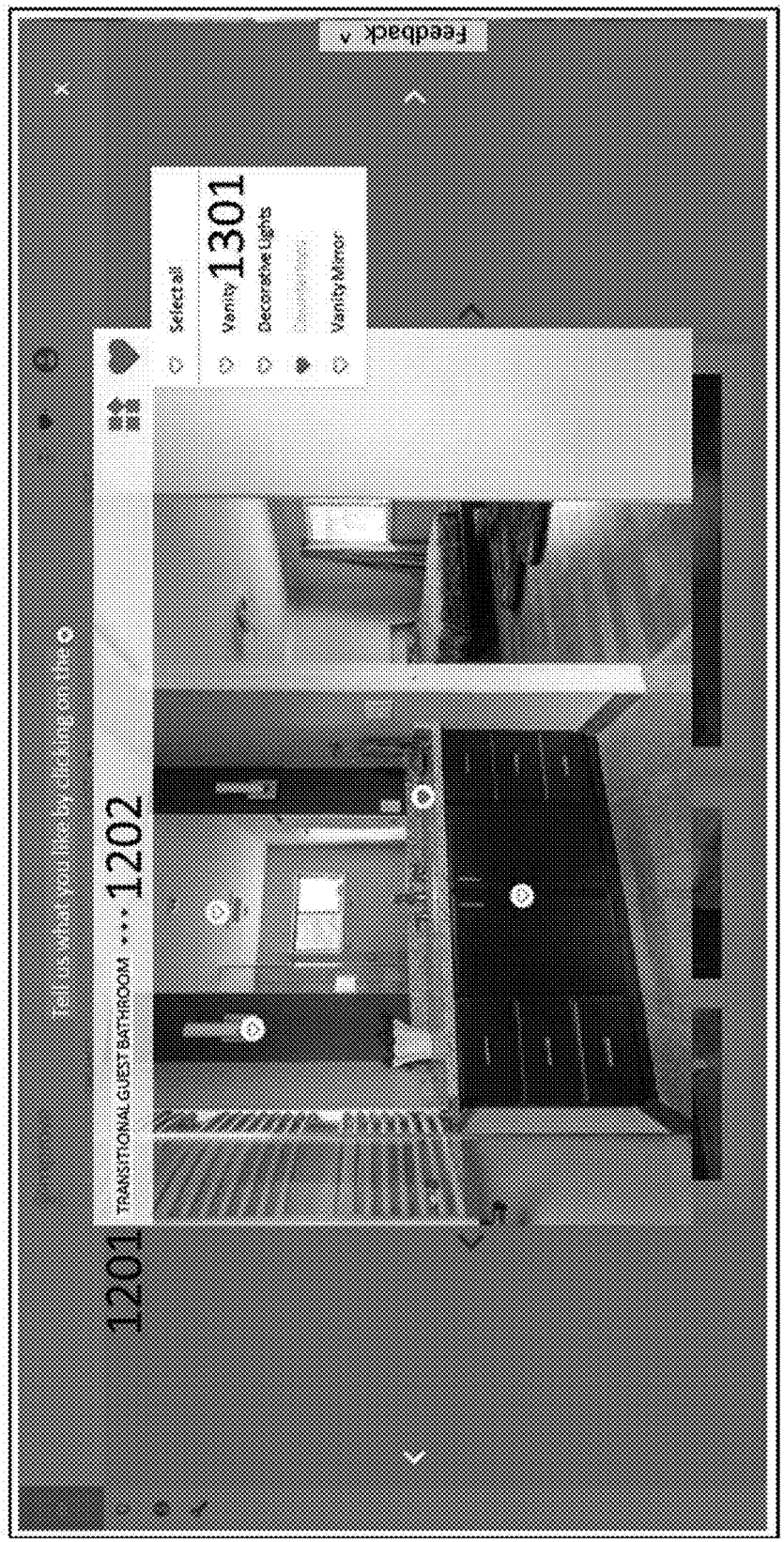
FIG. 14 shows a non-limiting example of a graphical user interface; in this case, a graphic user interface used in an application in order to provide an embodiment of drop down menus.
Figure 15:
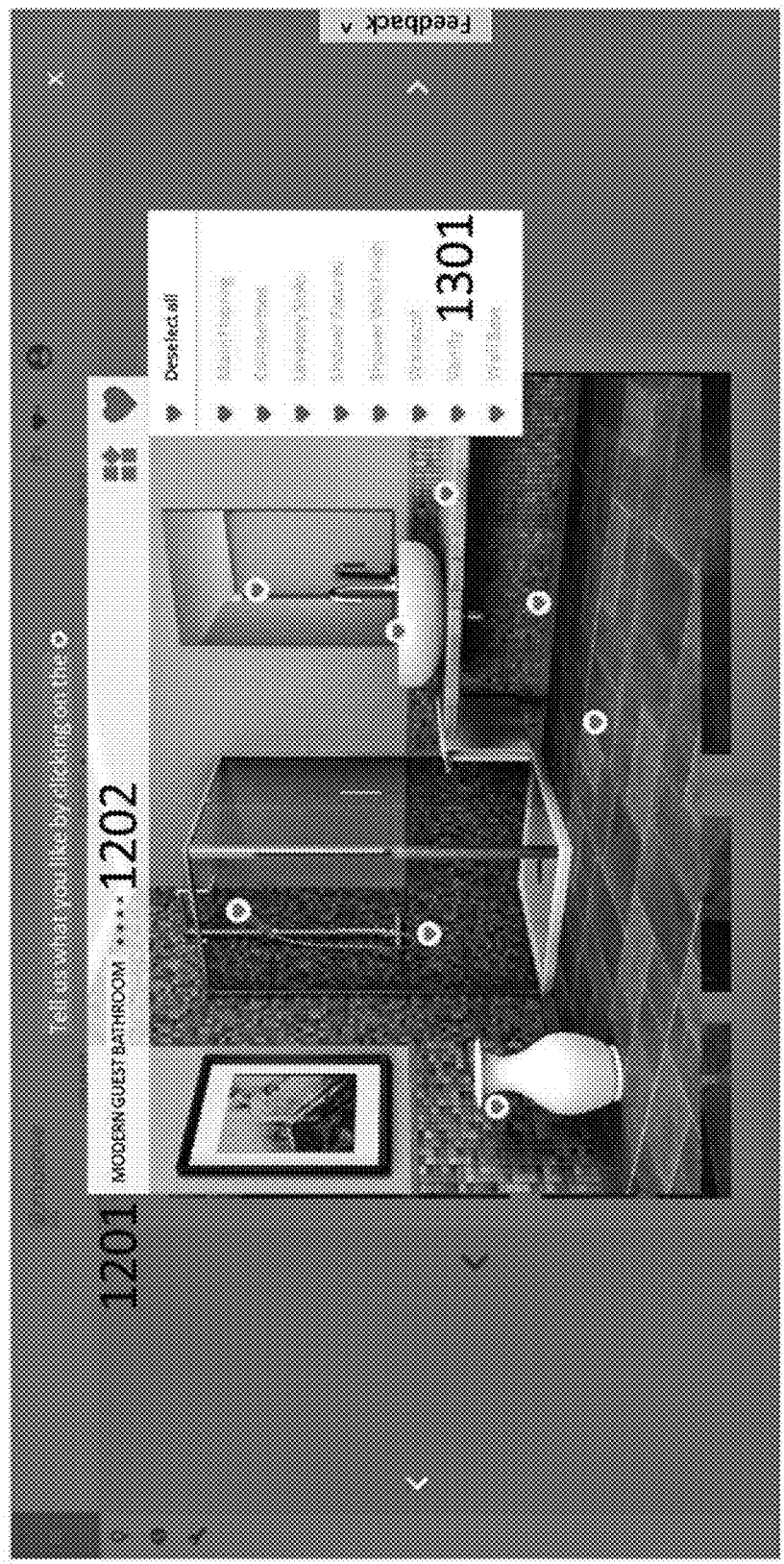
FIG. 15 shows a non-limiting example of a graphical user interface; in this case, a graphic user interface used in an application in order to provide an embodiment of drop down menus.
Figure 16:
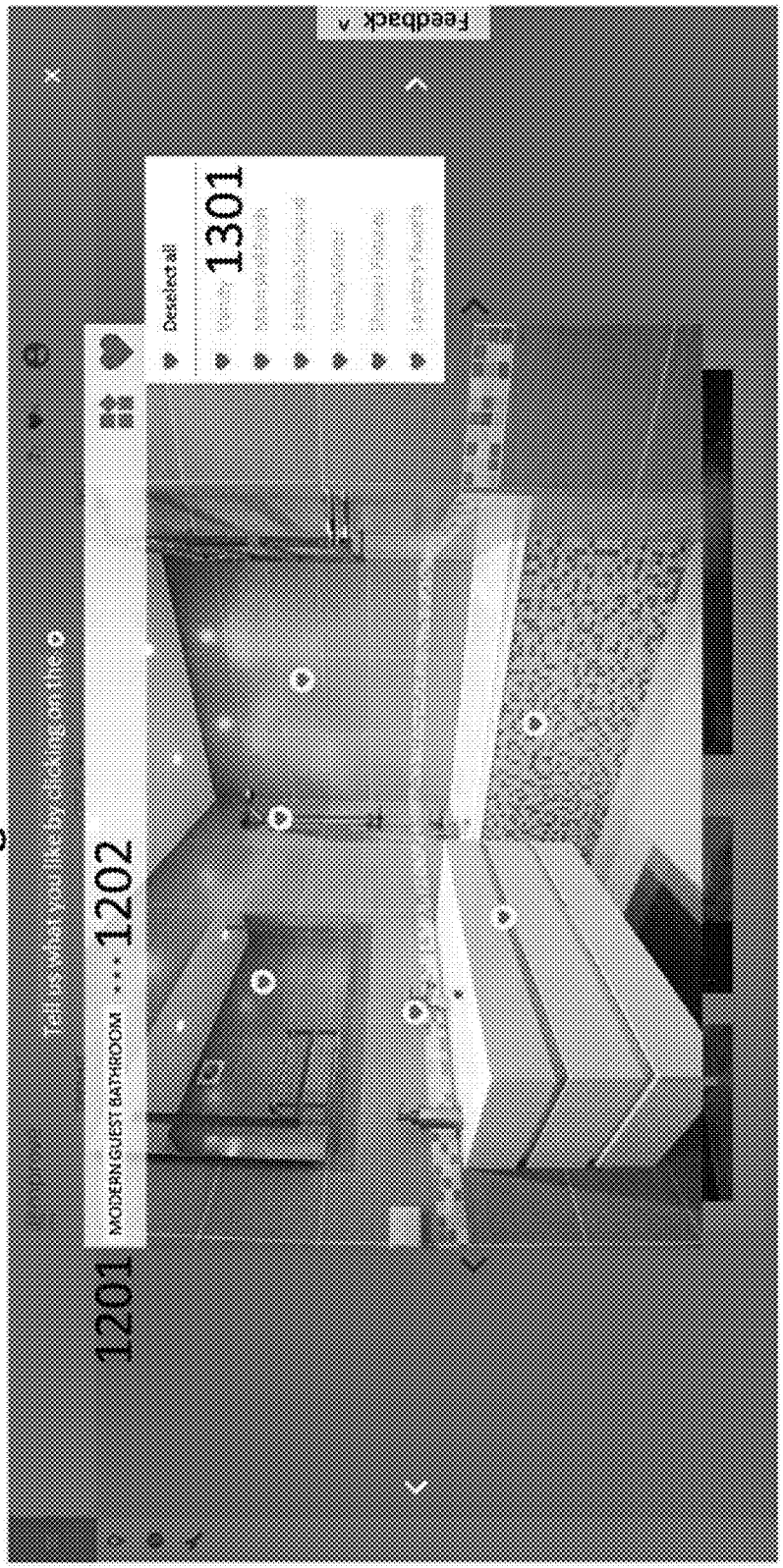
FIG. 16 shows a non-limiting example of a graphical user interface; in this case, a graphic user interface used in an application in order to provide an embodiment of drop down menus.

In some embodiments, an image may be selected and enlarged to better view the items within, view image specifications, or to indicate the user's preference of particular items or features in the image. FIG. 12 shows a selected image of interest. Descriptor 1201 indicates the style and home area, while 1202 indicates the measure of quality. The title text (1203) provides instruction to the user to select any preferred items or features within the image. Icon 1204 indicates that a sufficient number of images have been selected to review the user's Styleboard. In some embodiments, the Styleboard is a menu that displays the preferred items as categorized by scope item category. In some embodiments, a Styleboard is a composed set of reference images that collectively convey the design style that the consumer would like to achieve for a particular space or project. Developing a Styleboard helps the consumer reconcile the various styles and materials that he or she prefers across each major scope element (such as: flooring, countertops, cabinets, lighting, etc.) for a particular space. The Styleboard helps the consumer to visually describe his or her expectations. Icon 1205 indicates where the user should select if the use prefers the counter top. Selecting icon 1206 displays a dropdown menu that identifies each selectable preference icon within the image. FIGS. 13-16 show various examples the drop down menu (1301), and how the selection of the drop down icons mirrors the preference icons within the image. FIGS. 13-16 also show the different styles, arena types, and quality ratings of the rooms within the images.

Figure 17:
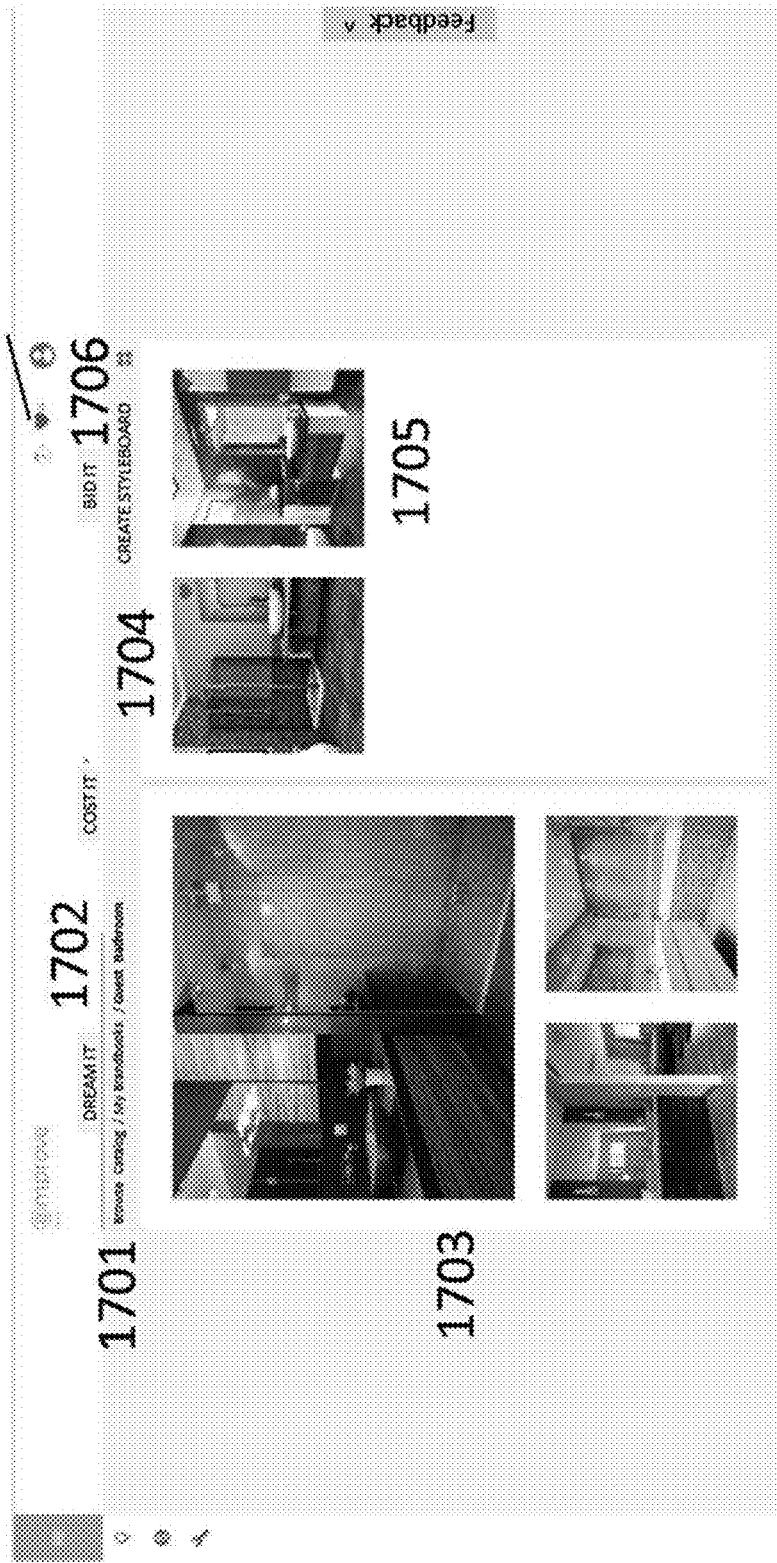
FIG. 17 shows a non-limiting example of a graphical user interface; in this case, a graphic user interface used in an application in order to provide an embodiment of particular image groupings.
Figure 18:
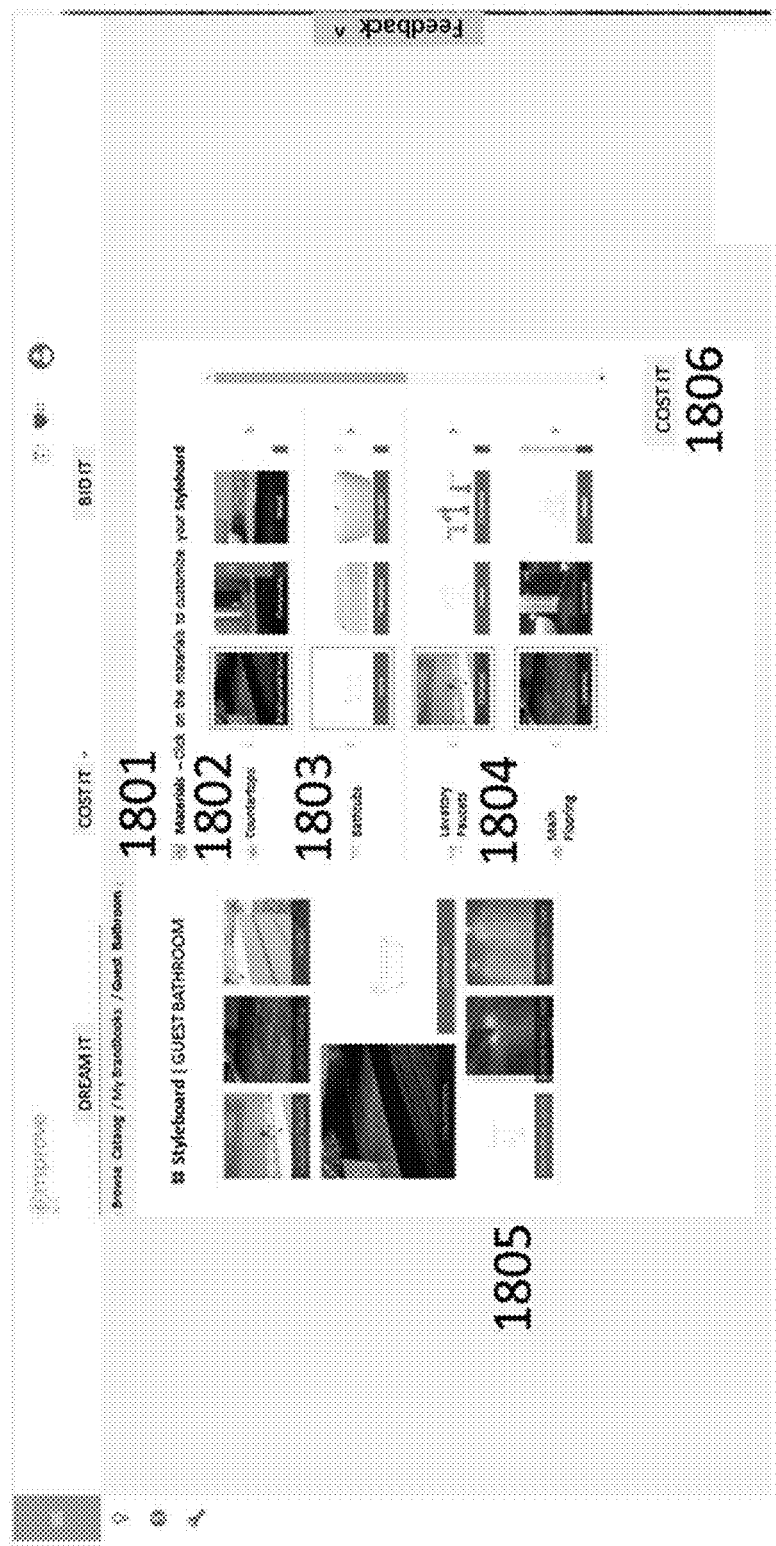
FIG. 18 shows a non-limiting example of a graphical user interface; in this case, a graphic user interface used in an application in order to provide an embodiment of particular image groupings.

In some embodiments, when the user has indicated a preference for two or more items within a home area, the Brandbook becomes available for review. Selecting icon 1004b, allows user to view their Brandbook and home area favorites. Upon selecting a particular home area, the application displays previously preferred images (FIG. 17). Selecting the text of icon 1701 allows the user to continue selecting images in the catalogue. Text 1702 indicates which home area the user is viewing. Images 1703, 1704, and 1705 indicate that the images include features that the user prefers. Selecting text 1706 allows for the user to create a Styleboard, as shown in FIG. 18. The Styleboard allows a user to select specific fixtures, finishes and items to populate a given house area. Text 1801 instructs to user to select the materials that the user would prefer to use in the present Styleboard. Text 1802 indicates a selection of countertops that the user may prefer, while text 1803 and 1804 present bathtubs and lavatory fixtures for selection. Where the user has not indicated a preference in images or selection, a placeholder image (1805) allows the user to recognize that a selection can be made. Materials for selection are resultant from the images specified previously, as well as predicted preferences generated in part by the machine learning algorithms. Selecting the "COST IT" button 1806, advances the user to creating a cost plan.

COST IT

In some embodiments, upon arrival in "COST IT," the consumer addresses a set of bespoke project-related questions. In some embodiments, included in these questions, is for the consumer to select a Project Scope from a set of defined Project Scope packages: Repaint Only, Hard Refresh, Light Renovation, Full Renovation. Each package is defined through the assignment of work action (e.g., remove, replace, refinish, new, etc.) for each of a comprehensive set of project scope disciplines. The application then allows the consumer to customize each package to their specific requirements. At this stage, the system has learned the extents of project scope that the consumer is considering.

In some embodiments, the system presents the consumer with auto-generated room size information for them to confirm or adjust. Upon confirmation, the platform delivers a detailed and comprehensive Project Cost Estimate, itemized by each trade discipline. The Project Cost Estimate is a direct product of the information the platform has learned from the consumer and can be customized further by changing or refining the "look-of", material, type, grade, finish, size of each item. As part of the Project Cost Estimate, the platform has estimated the quantity of each scope item as the basis to apply the unit cost to. In some embodiments, the Project Cost Estimate is an estimation which comprises of material costs, labor costs, overhead costs, profits, and contingency costs. In some embodiments, contingency costs cover the costs of items of work which are not known at the time of the cost estimate but which might occur. In some embodiments, contingency costs are calculated with use of statistical and/or historical data.

Figure 19:
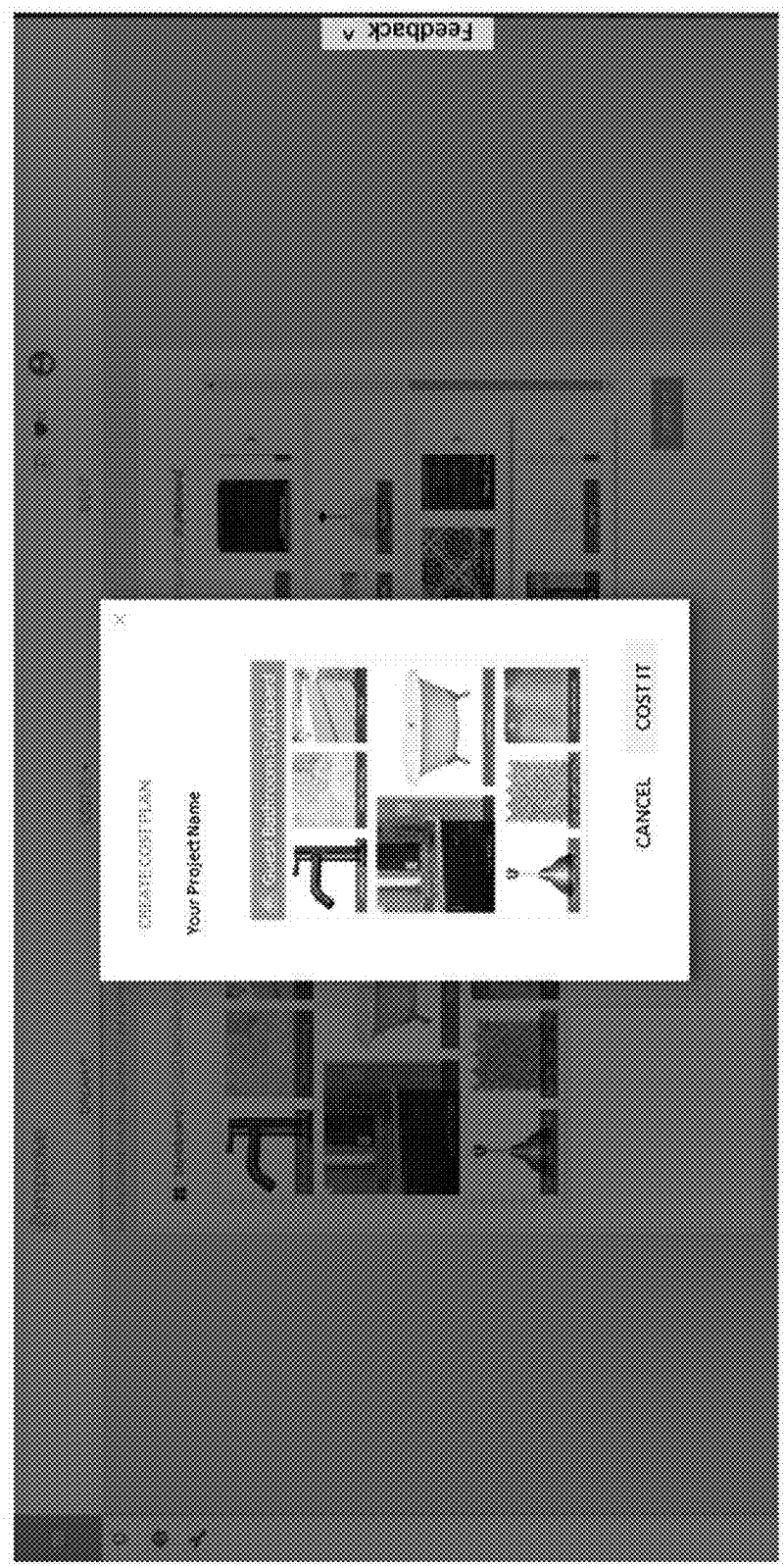
FIG. 19 shows a non-limiting example of a graphical user interface; in this case, a graphic user interface used in an application in order to provide an embodiment depicting a prompt asking the user to create a cost plan.
Figure 20:
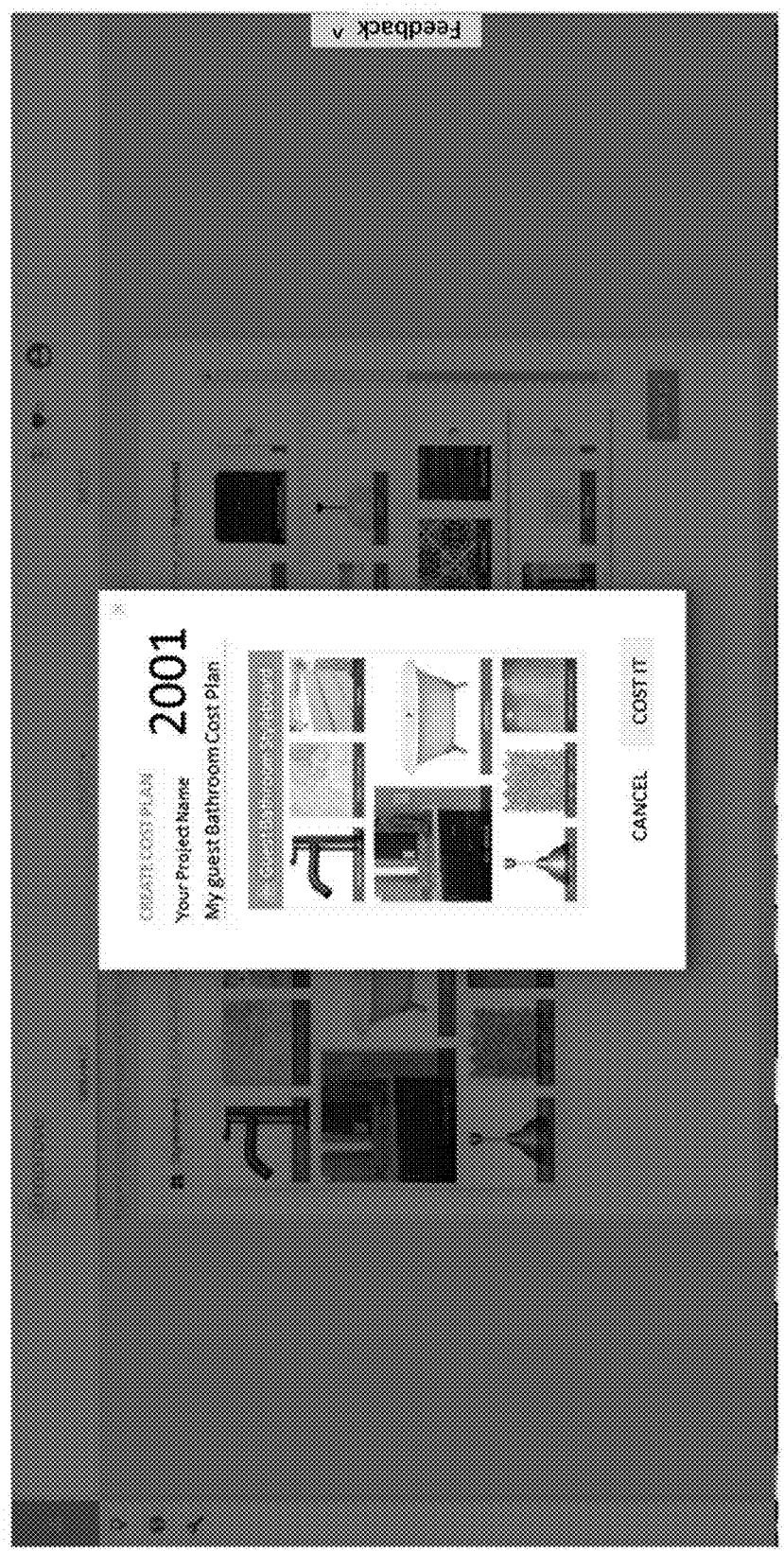
FIG. 20 shows a non-limiting example of a graphical user interface; in this case, a graphic user interface used in an application in order to provide an embodiment depicting a prompt asking the user to name a cost plan.
Figure 21:
FIG. 21 shows a non-limiting example of a graphical user interface; in this case, a graphic user interface used in an application in order to provide an embodiment depicting the steps require for a user to determine a cost estimate for their specified renovation.
Figure 22:
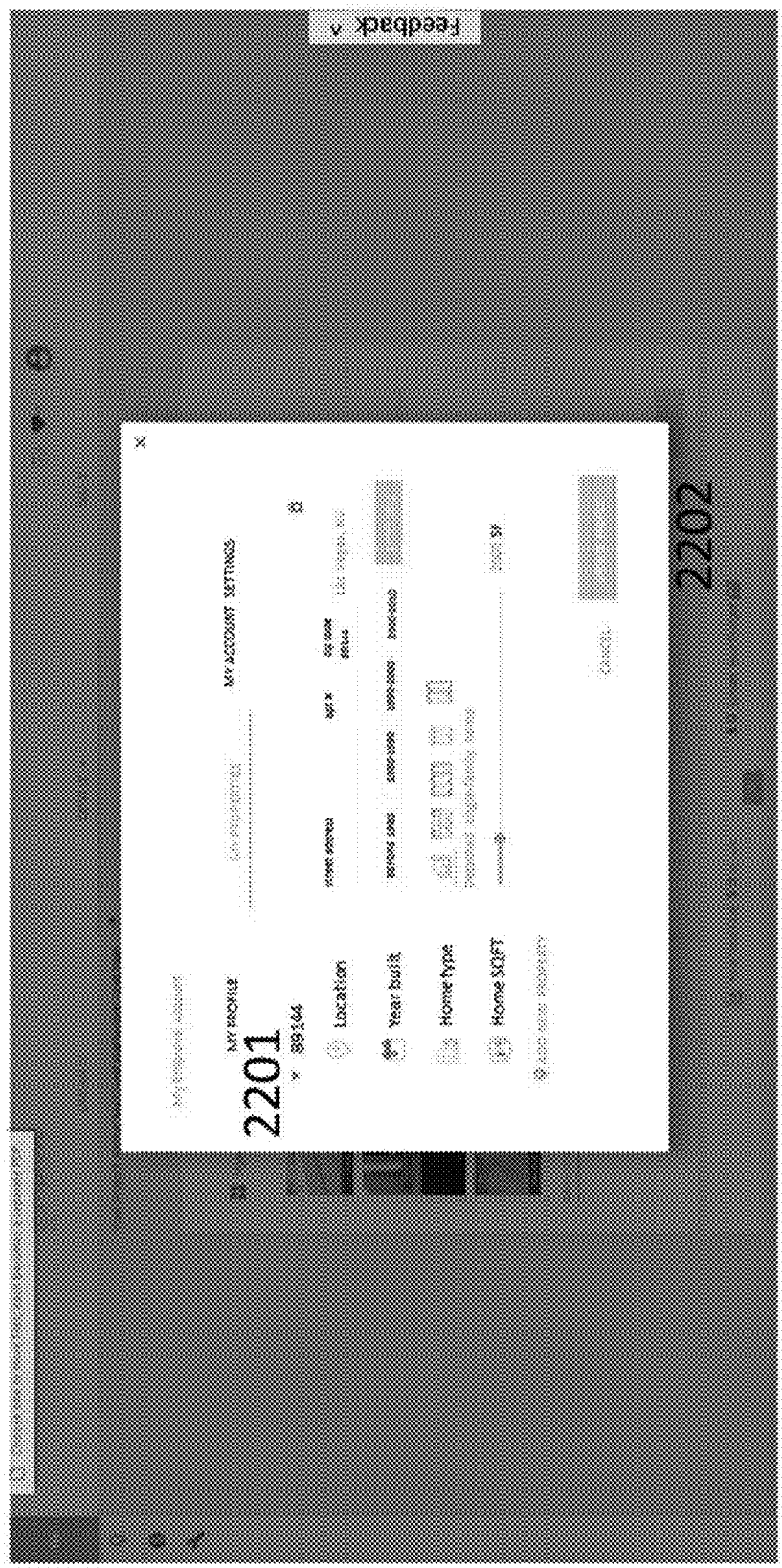
FIG. 22 shows a non-limiting example of a graphical user interface; in this case, a graphic user interface used in an application in order to provide an embodiment allowing the user to enter specific information about the property.
Figure 23:
FIG. 23 shows a non-limiting example of a graphical user interface; in this case, a graphic user interface used in an application in order to provide an embodiment allowing the user to specify the projects desired budget and scope.
Figure 24:
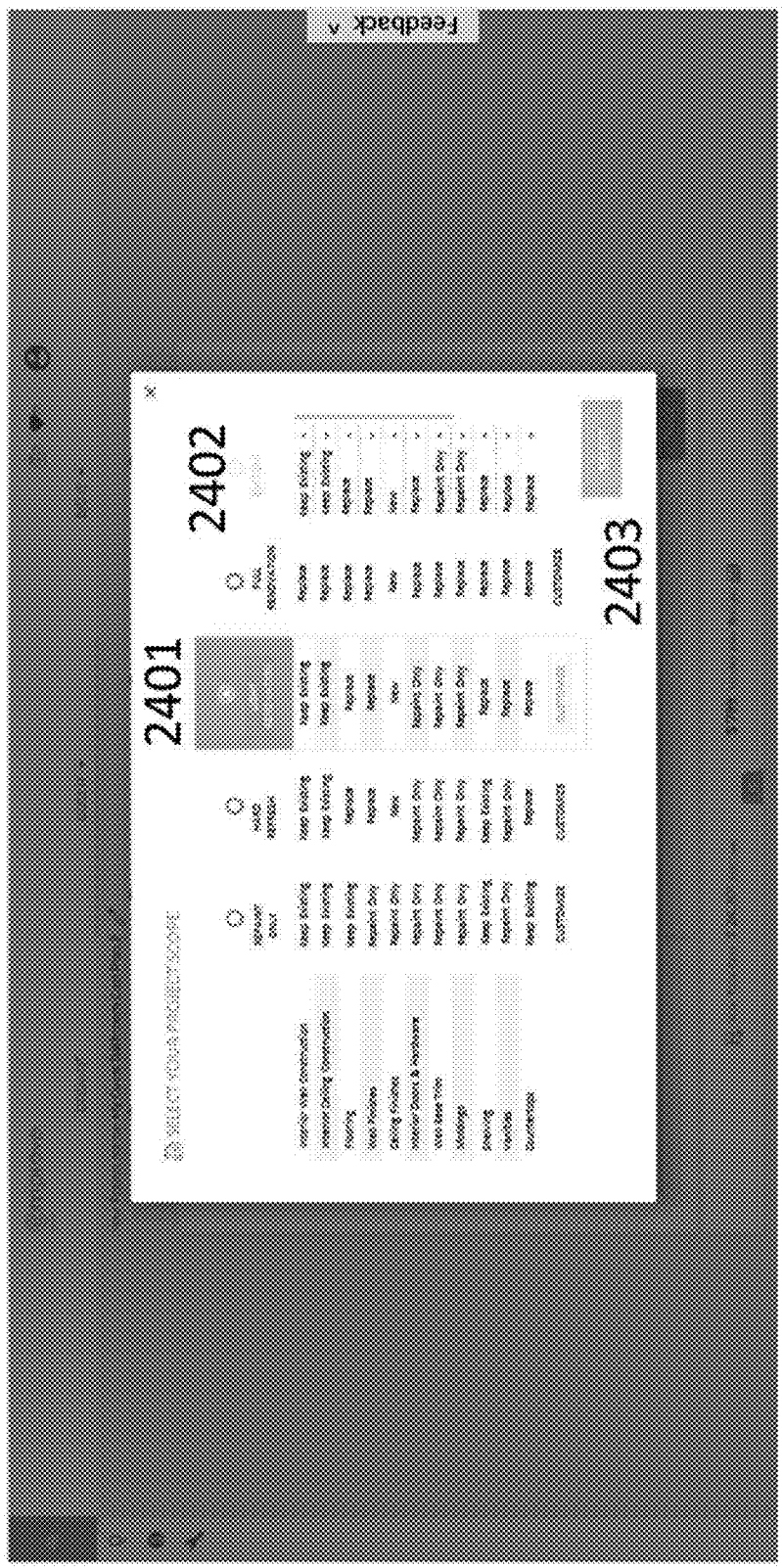
FIG. 24 shows a non-limiting example of a graphical user interface; in this case, a graphic user interface used in an application in order to provide an embodiment allowing the user to specify renovation targets.
Figure 25:
FIG. 25 shows a non-limiting example of a graphical user interface; in this case, a graphic user interface used in an application in order to provide an embodiment allowing the user to view the projected costs of the proposed renovation.
Figure 26:
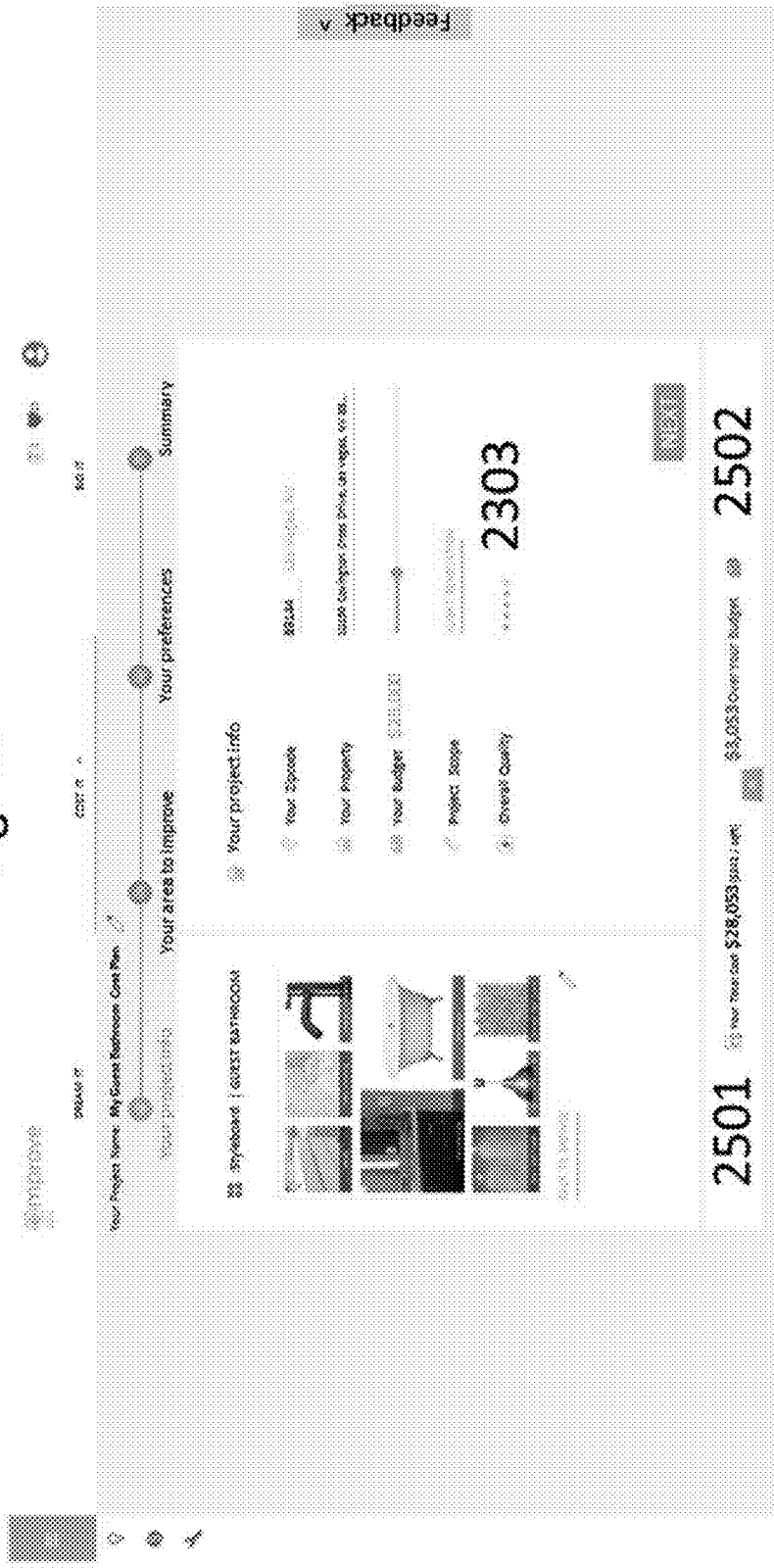
FIG. 26 shows a non-limiting example of a graphical user interface; in this case, a graphic user interface used in an application in order to provide an embodiment allowing the user to change renovation goals and review updates to the proposed cost.

Non limiting examples of the application's "COST IT" graphical user interface are shown in FIGS. 19-33. In some embodiments, when creating a cost plan (FIGS. 19 and 20), the user provides a name to the project (2001). The tabs within "COST IT" represent the 4 steps required (FIG. 21). Tab 2101 requires the user input general information for the project. Tab 2102 requires the user to select the area size and location for improvement. Tab 2103 allows the user to select construction materials preferences. Tab 2104 presents a summary. Under the general information tab (2101) the Styleboard for the current project is displayed (2105). Field 2106 allows for the user to input the property's zip code, while 2107 allows the user to input the property's address. Upon selecting 2107, a property menu (FIG. 22) allows the user to enter specific information about the property, including address, year built, home type and home square footage. This menu can also be accessed by selecting the profile icon 1004c. The user can update his or her profile be selecting the "update profile" button 2202. FIG. 23 displays the additional information required to complete the general information tab. Sliding bar 2301 allows the user to specify the projects desired budget. The project scope (2302) and overall quality (2303) can be specified as well. Upon selecting the project scope option 2302, a menu appears (FIG. 24) allowing the user to select target areas for renovation. The user can select from preset levels of renovation (2401), or customize each aspect of the renovation (2402). Selecting an option via button 2403 enables the user to resume assessing costs. FIG. 25 shows a user's general project information, the projected cost estimate (2501) and the remainder or overburden on the user's desired budget (2502). By adjusting the general information (FIG. 26), the application updates the estimated costs accordingly.

Figure 27:
FIG. 27 shows a non-limiting example of a graphical user interface; in this case, a graphic user interface used in an application in order to provide an embodiment allowing the user to specify the projects square footage and area.
Figure 28:
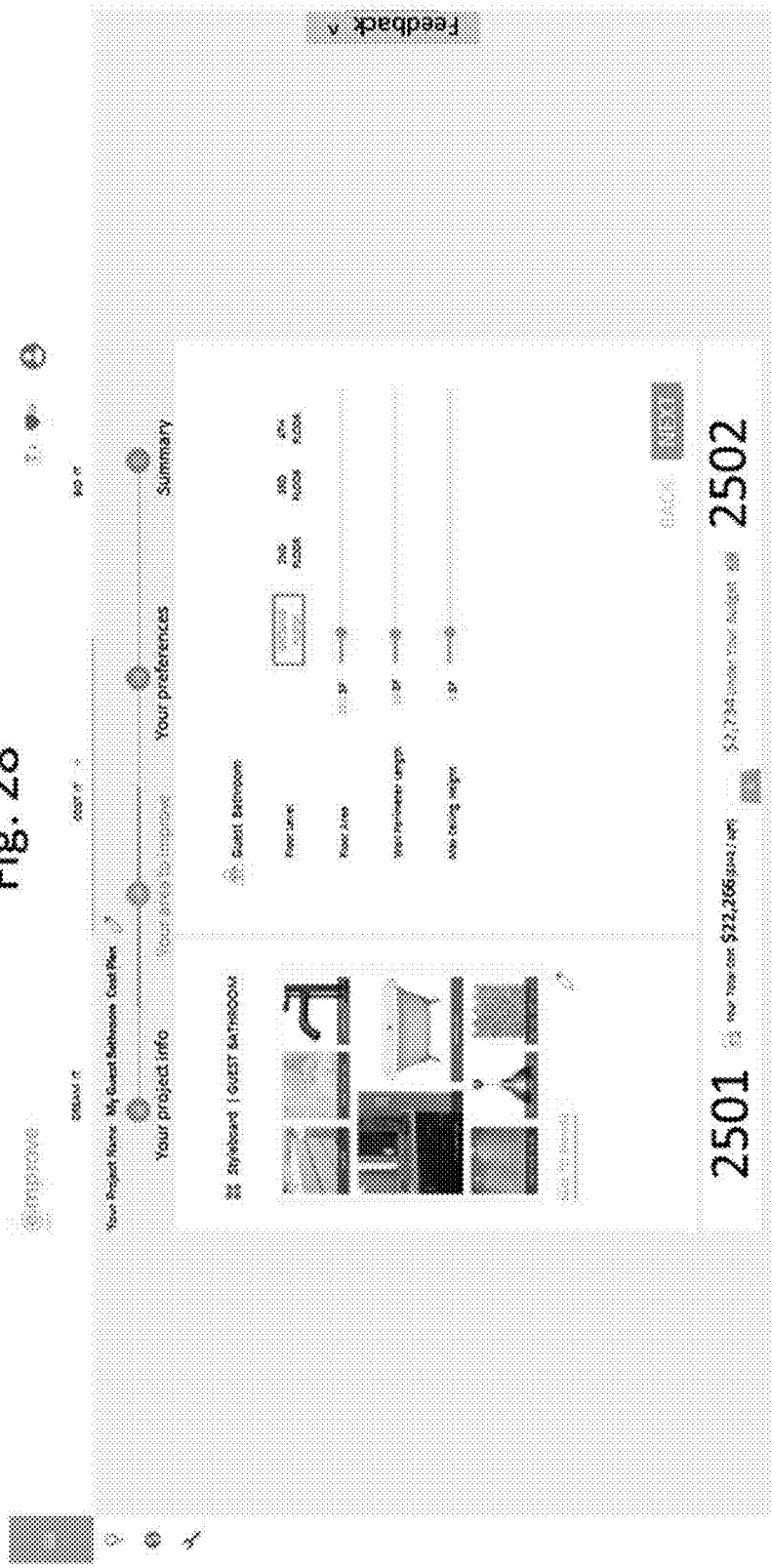
FIG. 28 shows a non-limiting example of a graphical user interface; in this case, a graphic user interface used in an application in order to provide an embodiment allowing the user to view the projects estimated costs.

In some embodiments, FIG. 27 shows the tab for a user to specify the dimensions and location of the house area being improved. Square footage, area perimeter footage and wall height can be adjusted through the use of sliders (2701). The user may also specify what elevation the house area is (2702). By adjusting the area information (FIG. 28), the application updates the estimated costs of the improvements accordingly.

Figure 29:
FIG. 29 shows a non-limiting example of a graphical user interface; in this case, a graphic user interface used in an application in order to provide an embodiment allowing the user to specify the projects construction materials.
Figure 30:
FIG. 30 shows a non-limiting example of a graphical user interface; in this case, a graphic user interface used in an application in order to provide an embodiment allowing the user to update the costs in response to the selection of various construction materials.
Figure 31:
FIG. 31 shows a non-limiting example of a graphical user interface; in this case, a graphic user interface used in an application in order to provide an embodiment allowing the user to view a detailed breakdown of project costs.

In some embodiments, FIGS. 29 and 30 show the preferences tab and indicate examples of a user's desired construction materials (2901 and 2902). The application updates the estimated costs according to the selected materials (2501 and 2502). In this way, a user can accurately weigh the costs and aesthetic benefits of choosing one material over another. By selecting the double up arrow icon (3001), the user is able to view an exhaustive breakdown (FIG. 31) of the amounts and costs of all materials (3101). In some embodiments, the user can edit the costs directly to provide a more accurate estimate (3102).

Figure 32:
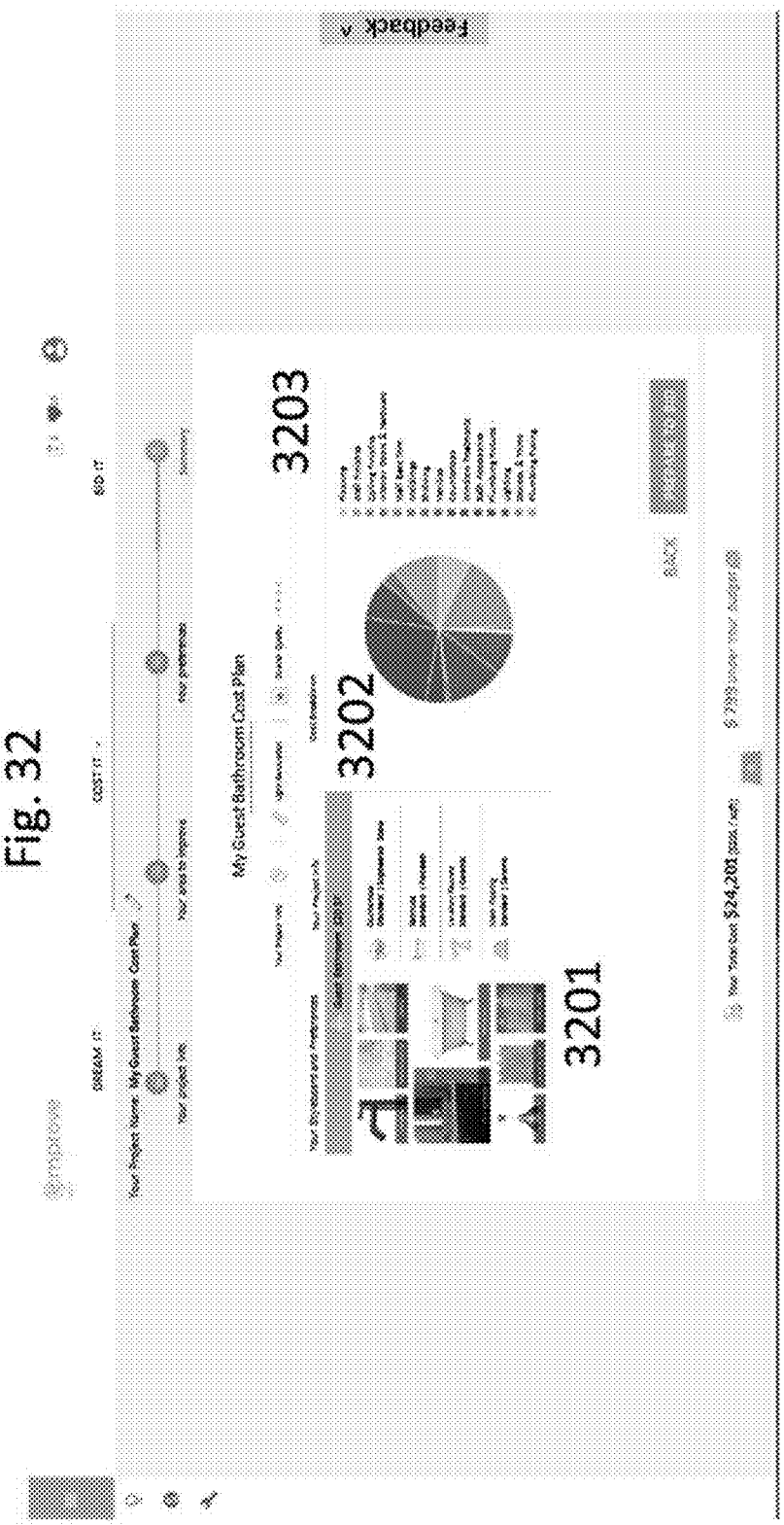
FIG. 32 shows a non-limiting example of a graphical user interface; in this case, a graphic user interface used in an application in order to provide an embodiment allowing the user to view a summary of the project.
Figure 33:
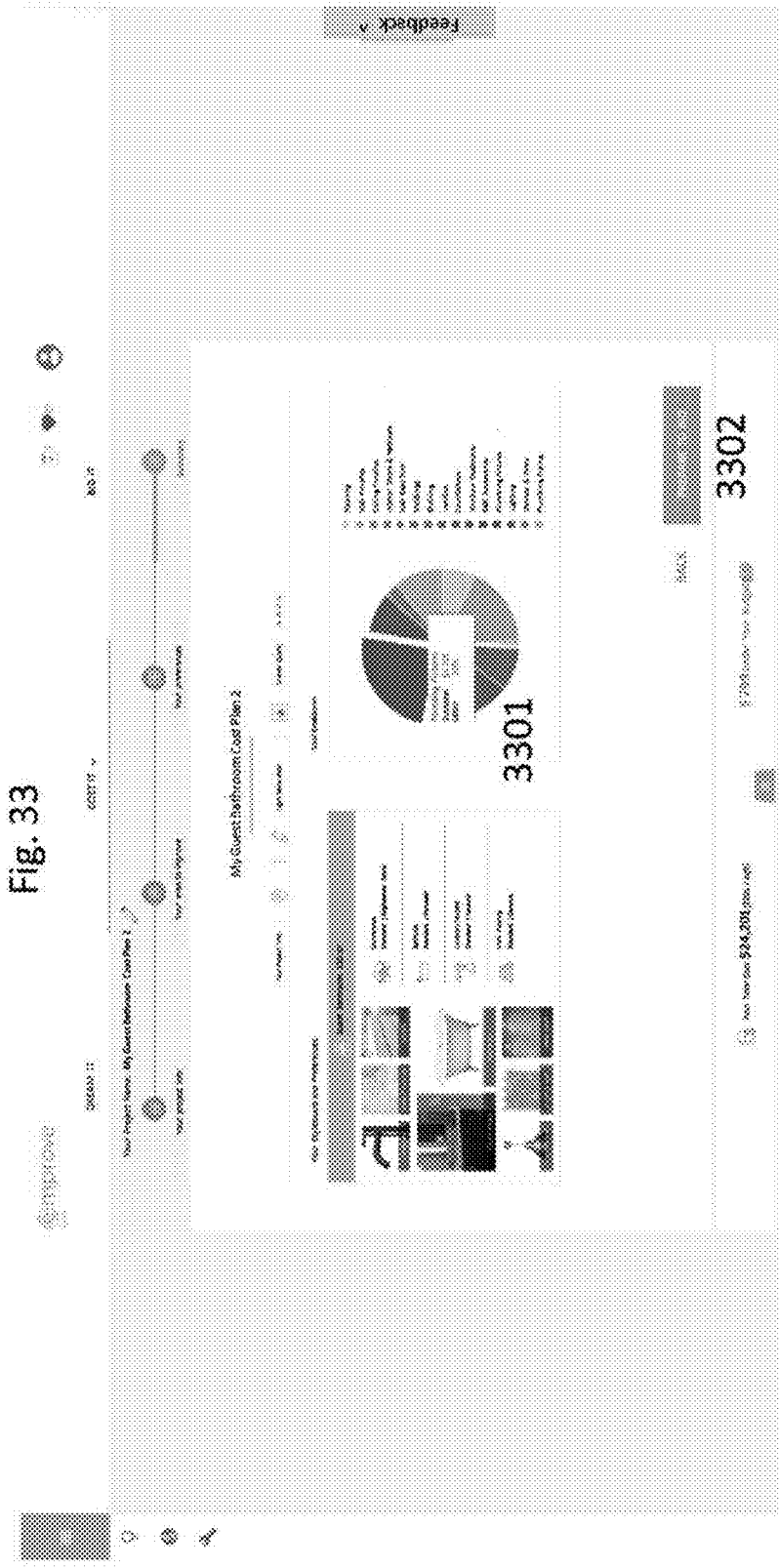
FIG. 33 shows a non-limiting example of a graphical user interface; in this case, a graphic user interface used in an application in order to provide an embodiment allowing the user to view a summary of the project.

In some embodiments, FIGS. 32 and 33 show the summary tab and present the users preferred styles (3201) and a breakdown of the estimate costs in the form of a pie chart (3202) with color coded index (3203). Selecting a portion of the pie presents additional information on projected labor and material costs (3301). Selecting the "PREPARE TO BID" button (3302) advances the uses to the "BID IT" phase of RFT generation.

BID IT

In some embodiments within the "BID IT" step, the system prepares a commercial-grade Request for Proposal (RFP) package based on the consumers finalized Project Scope. The RFP includes the relevant project parameter, site logistics, existing site photos, general condition requirements, and contract terms necessary for a contractor to fully consider the project opportunity.

Figure 34:
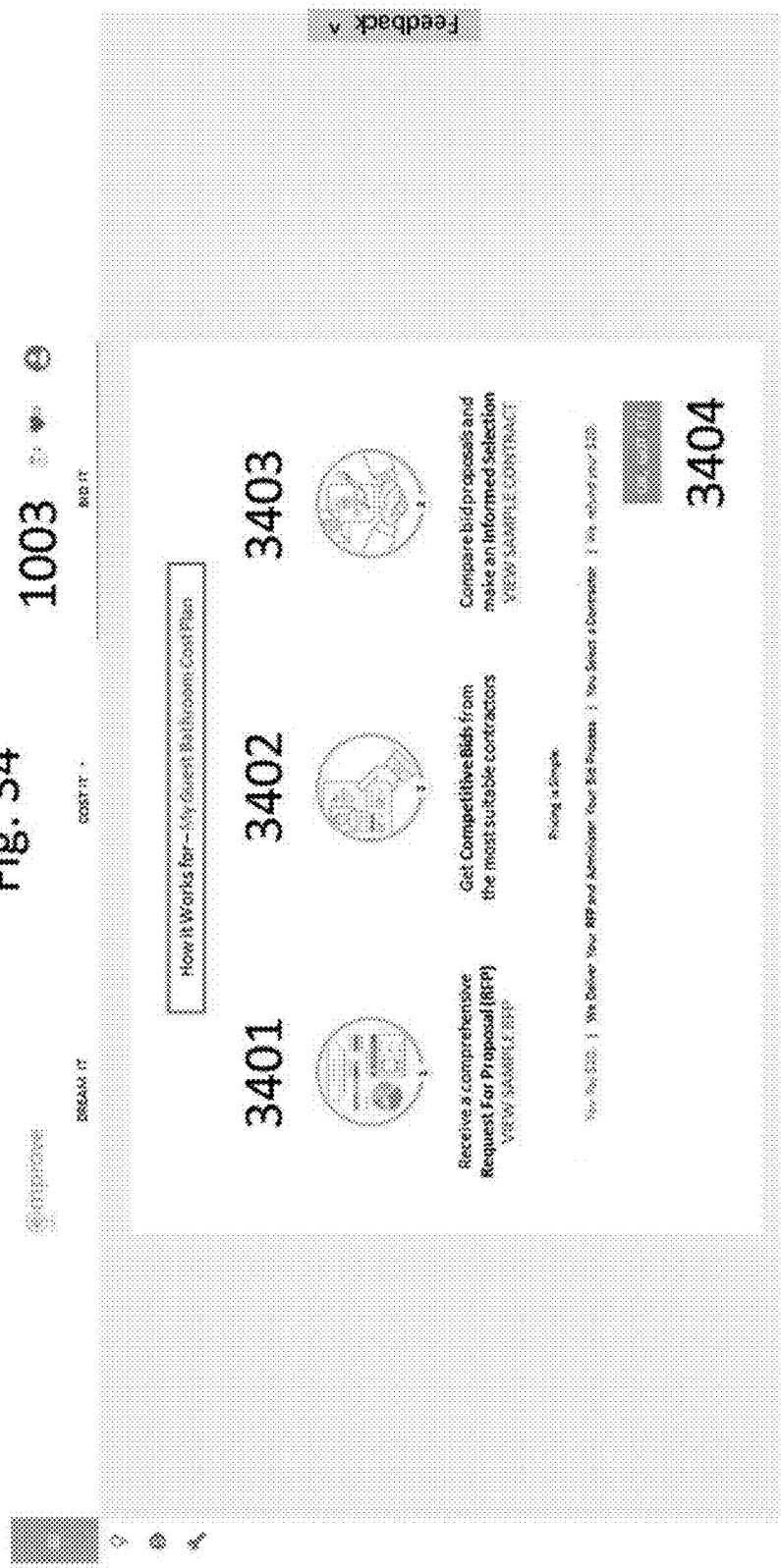
FIG. 34 shows a non-limiting example of a graphical user interface; in this case, a graphic user interface used in an application in order to provide an embodiment allowing the user generate an RFP, acquire project bids and compare said bids.
Figure 35:
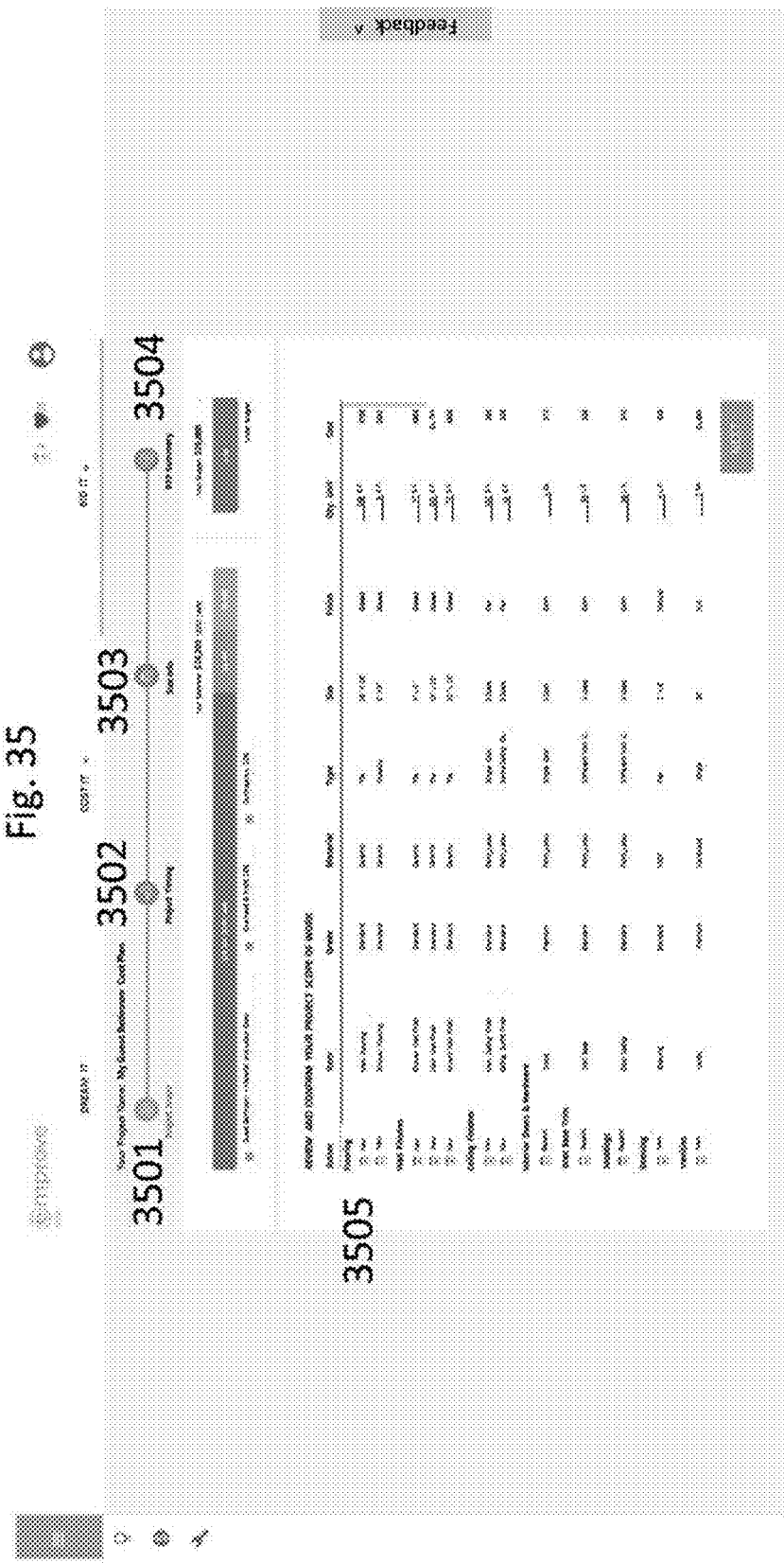
FIG. 35 shows a non-limiting example of a graphical user interface; in this case, a graphic user interface used in an application in order to provide an embodiment allowing the user to specify the project goals related to timing and site logistics.
Figure 36:
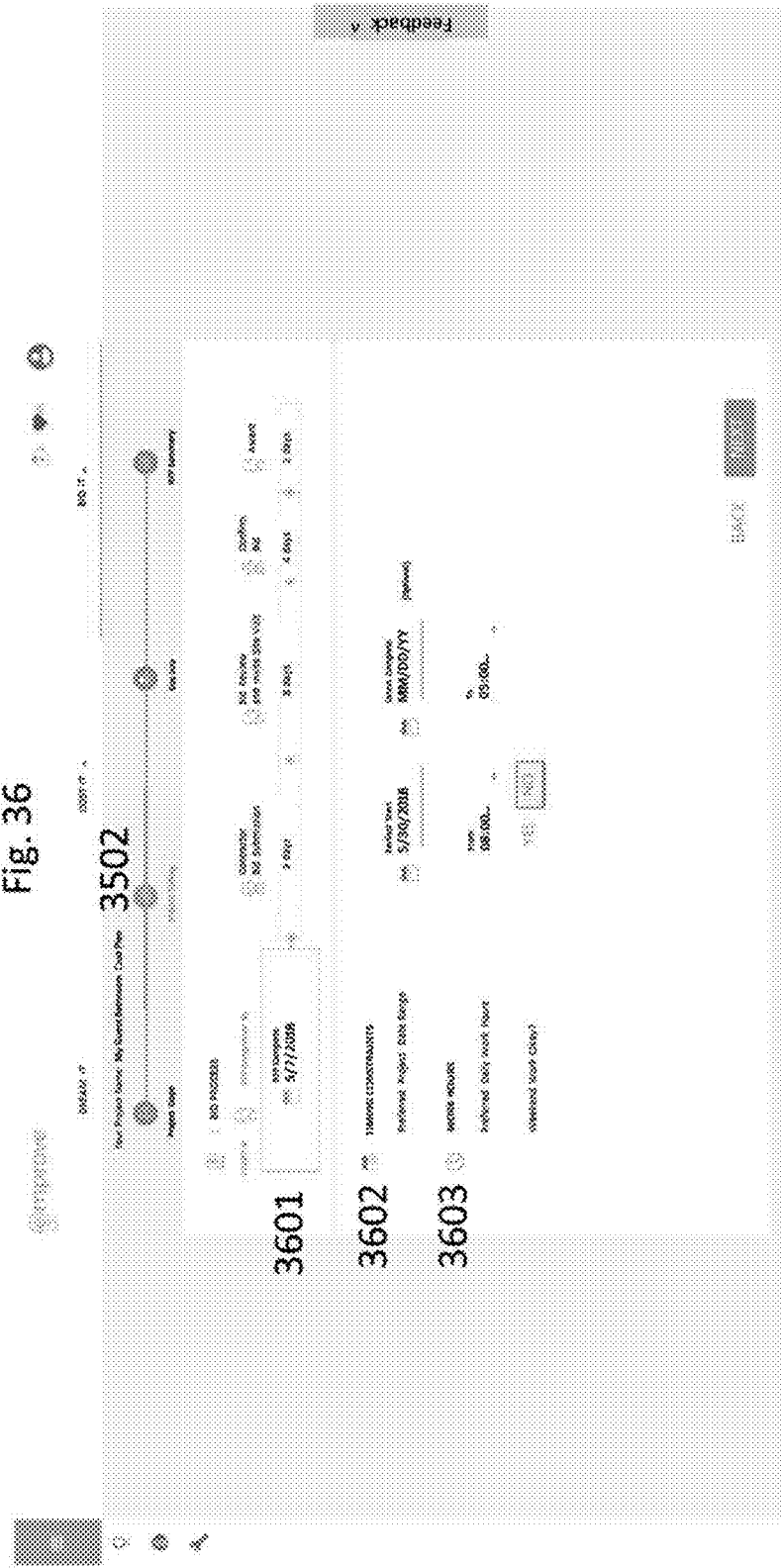
FIG. 36 shows a non-limiting example of a graphical user interface; in this case, a graphic user interface used in an application in order to provide an embodiment allowing the user to specify timing specifics.
Figure 37:
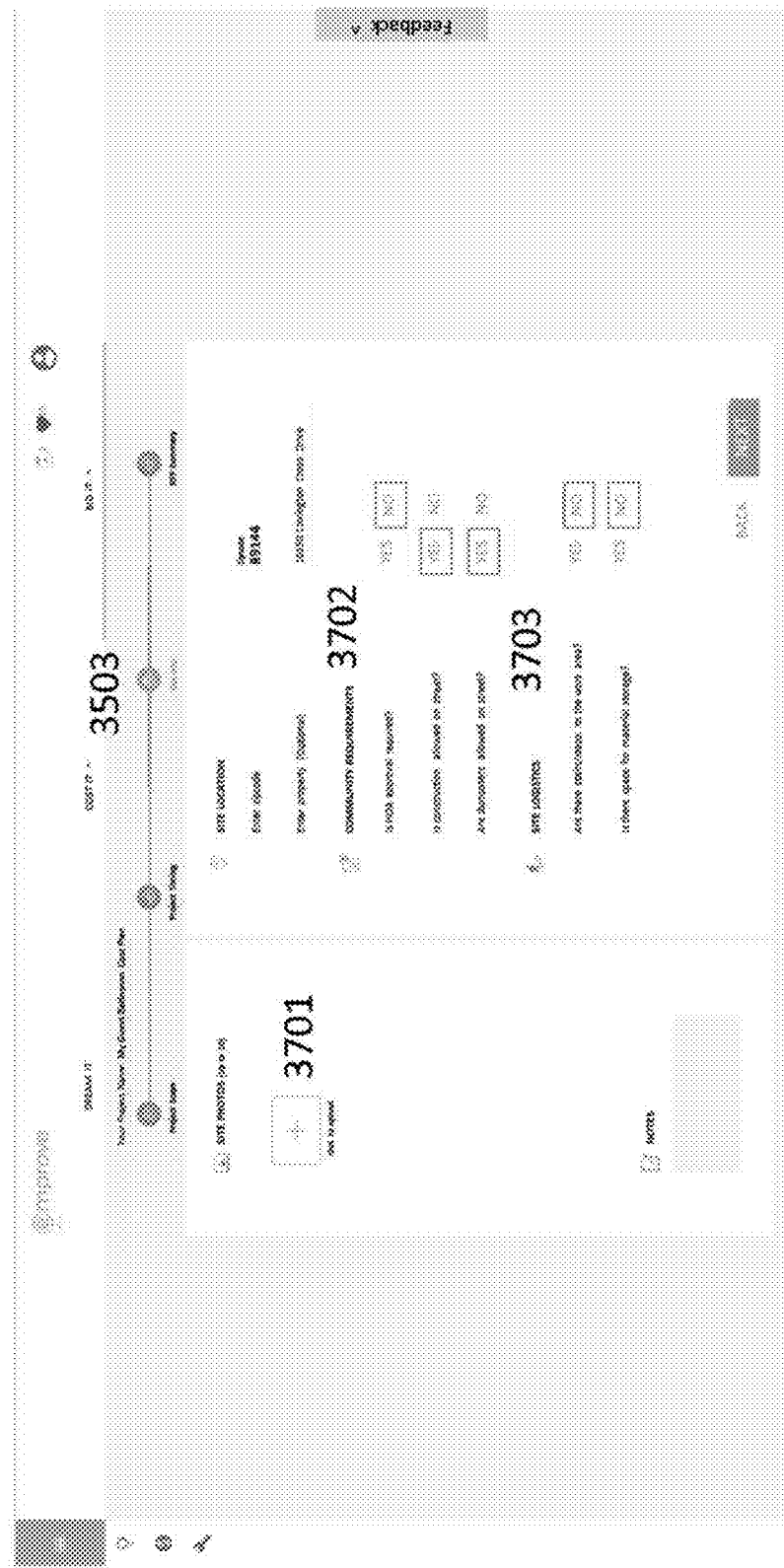
FIG. 37 shows a non-limiting example of a graphical user interface; in this case, a graphic user interface used in an application in order to provide an embodiment allowing the user to input site information.
Figure 38:
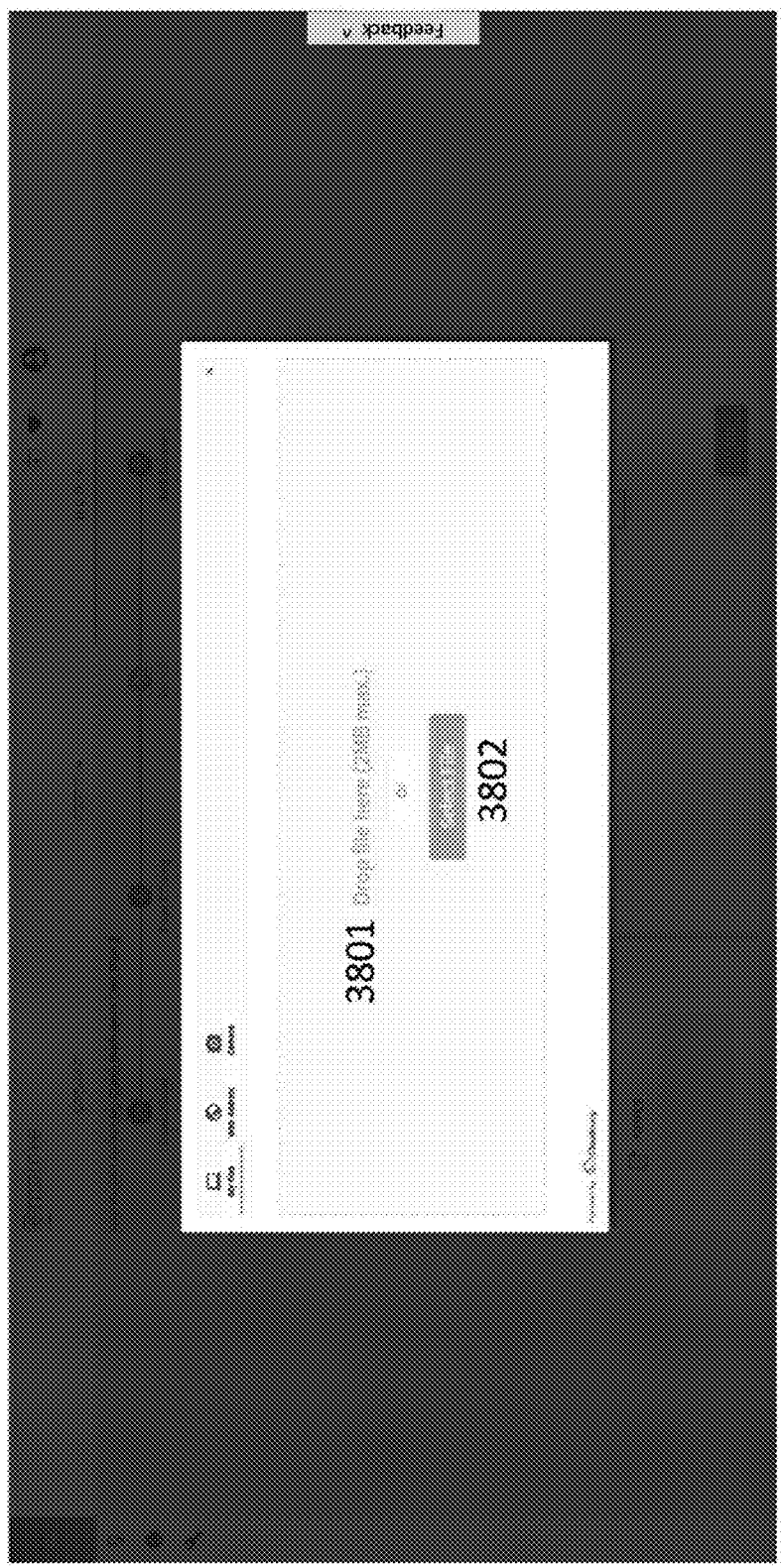
FIG. 38 shows a non-limiting example of a graphical user interface; in this case, a graphic user interface used in an application in order to provide an embodiment allowing the user to upload an image of the site.
Figure 39:
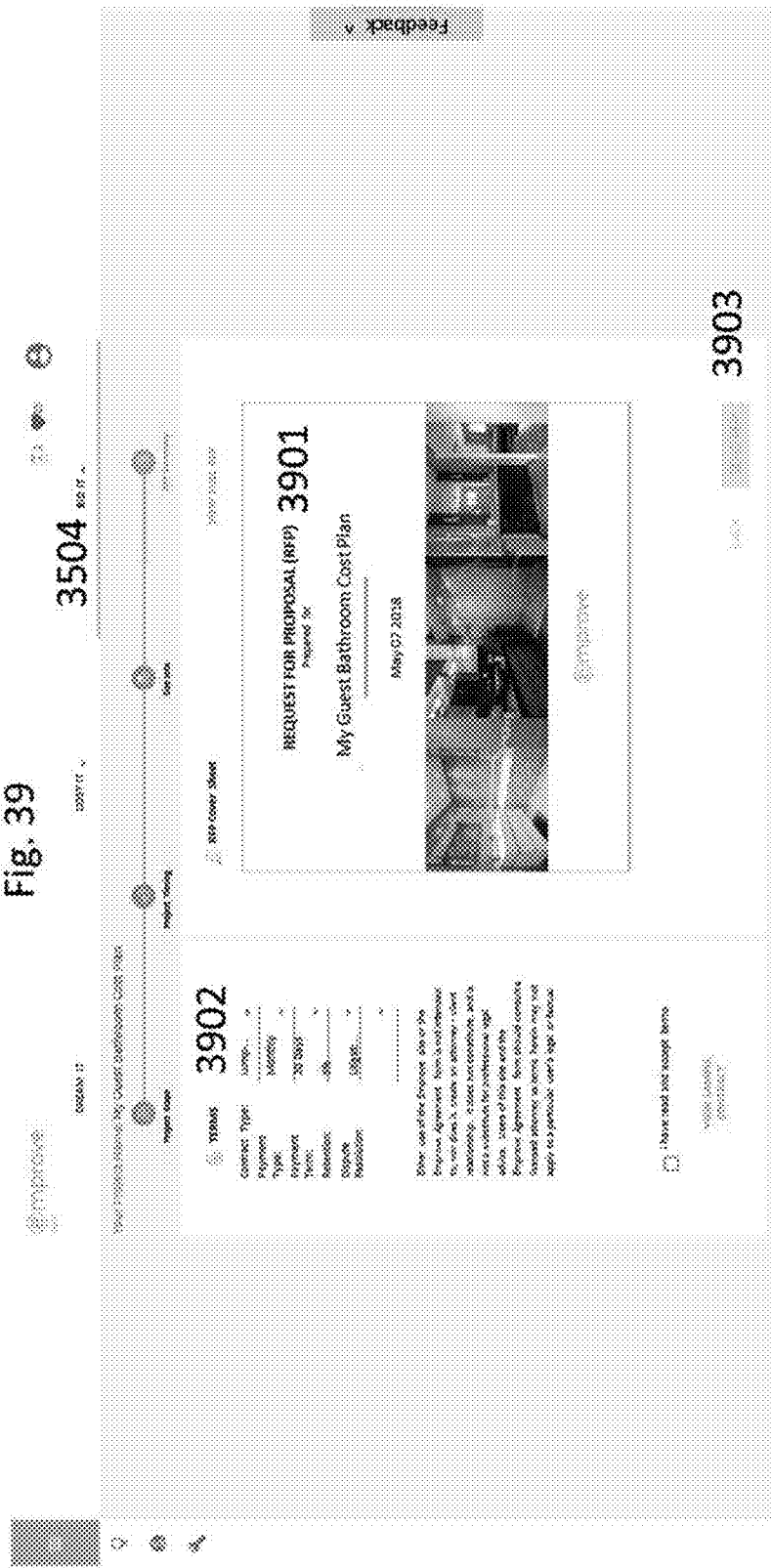
FIG. 39 shows a non-limiting example of a graphical user interface; in this case, a graphic user interface used in an application in order to provide an embodiment allowing the user to specify contract and payment terms.
Figure 40:
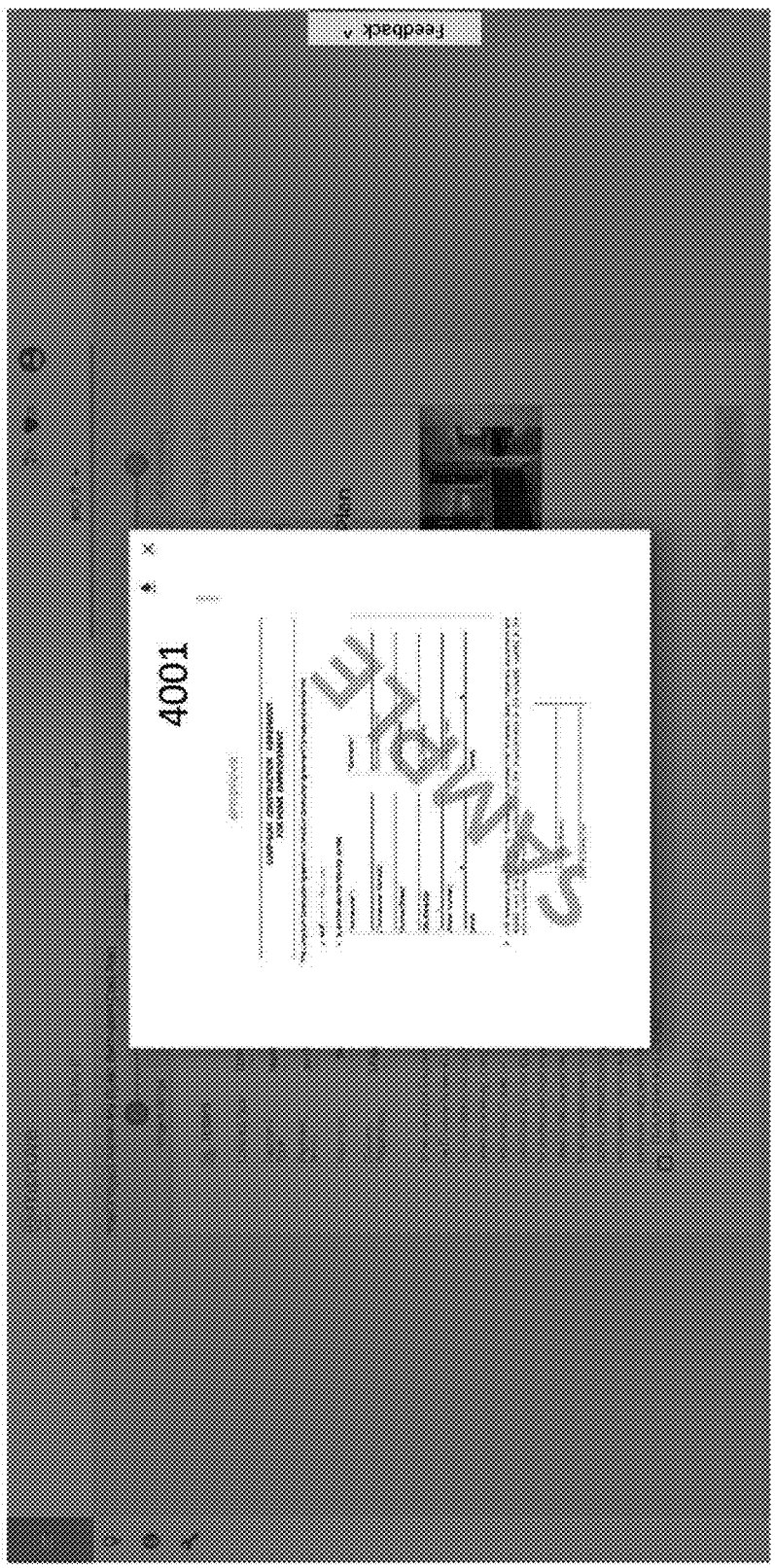
FIG. 40 shows a non-limiting example of a graphical user interface; in this case, a graphic user interface used in an application in order to provide an embodiment allowing the user to specify terms of agreement.
Figure 41:
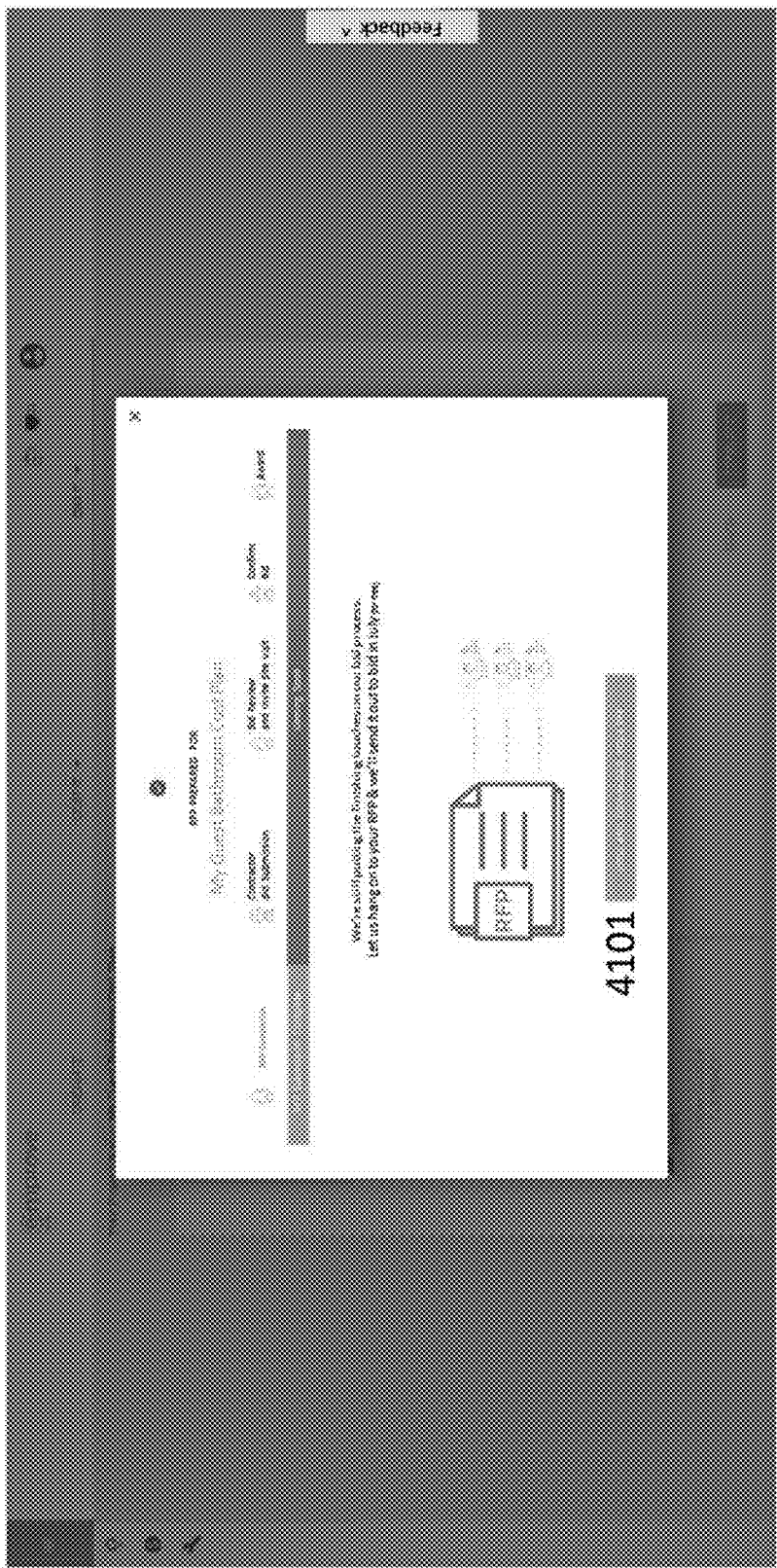
FIG. 41 shows a non-limiting example of a graphical user interface; in this case, a graphic user interface used in an application in order to provide an embodiment allowing the user to generate terms of agreement.

In some embodiments, the "BID IT" tab (1003) provides the final step required for RPF generation by the consumer. FIG. 34 shows options available on the "BID IT" tab, which include generation of an RFP (3401), acquiring bids on the RFP (3402), and comparing bids and selecting a contractor (3403). Selecting the "OK, GOT IT!" button (3404) advances the user a series of tabs that allow the user to further detail their project goals (FIG. 35). Tabs include project scope (3501), project timing (3502), site information (3503), and RFP summary (3504). The project scope tab includes information detailing the items, grades, materials, type, size, finish, quantity of units and cost estimate (3505) of the project. Advancing to the "Project Timing" tab (3502 in FIG. 36) allows users input completion dates (3601), specify any timing constraints (3602), and desired work hours (3603). FIG. 37 shows the site information tab (3503), which allows the user to upload site photos for contractors to inspect. The user may also provide details regarding the community (3702) such as whether a home owners association's approval is required, whether construction parking is allowed on the street, and whether dumpsters are allowed on the street. Site logistics (3703) such are the presence of stairs and material storage can also be specified. If a user wishes to upload a picture of the site (FIG. 38), the file may be dropped onto the target window (3801) or selected by browsing through the users files (3802). The RFP Summary tab (3504 in FIG. 39) displays the RFP cover sheet (3901) and allows the user to specify desired terms of agreement (3902). Terms include contract type, payment type, retention, and dispute resolution. FIG. 40 shows an example of the contract generated (4001) following term selection. Following contract agreement, the RFP is generated (FIG. 41) and available for review (4101).

Marketplace

In some embodiments, the system then applies a machine learning assisted Contractor Matching Engine to select from its database of contractors a set of contractors who are best suited for the project given its unique set of circumstances. These contractors are invited to respond to the RFP from within the platform.

In some embodiments, upon accepting the invitation, the contractor engages the Bid Submission module where they efficiently progress through the RFP documents and are met with an intelligent Bid Form. The Bid Form presents the itemized project scope and associated quantities for the contractor to assign cost to. The contractor can also work up the granular cost of each item using the Cost Builder. The system draws from records of the contractors' previous bid values for similar scope items and presents the costs back to the contractor for reference.

In some embodiments, the system completes its administration of the Bid Process by evaluating the various bid submissions compliance with the original RFP parameters, and allowing the consumer to compare each submission side by side. The consumer may choose to invite any number of contractors for a site visit and evaluation, decline a contractor's bid, or request a final bid submission. A contractor who receives a request for a site invitation or final bid submission can optionally visit the project location and submit a final bid for the consumers review. If the consumer accepts a contractor's final bid submission, the contract is awarded and signed by both parties. If signatures are withheld or the contractor withdraws, the consumer is free to award the job to another contractor.

Terms and Definitions

Unless otherwise defined, all technical terms used herein have the same meaning as commonly understood by one of ordinary skill in the art to which this disclosure belongs.

As used herein, the singular forms "a," "an," and "the" include plural references unless the context clearly dictates otherwise. Any reference to "or" herein is intended to encompass "and/or" unless otherwise stated.

As used herein, the term "about" refers to an amount that is near the stated amount by 10%, 5%, or 1%, including increments therein.

As used herein, the term "request for proposal" or "RFP" is a document prepared for the purpose of soliciting competitive contractor bids which comprehensively specifies the work a consumer would like to get done as part of their project. The RFP may constitute a request for specified services and/or an invitation for bids from contractors. In some embodiments, an RFP is a property construction cost plan application.

As used herein, the term "bid" or "quote" is a contractor offer of a price the provide the requested services, as described by the RFP.

Machine Learning

In some embodiments, machine learning algorithms are utilized to aid in determining a consumer's preferred design elements. In some embodiments, the machine learning algorithm is used to suggest or recommend items and style elements to the consumer. In some embodiments, machine learning algorithms are utilized to aid in generating a cost estimate for a consumer's renovation designs and/or building proposal. In some embodiments, machine learning algorithms are utilized in the matchmaking process to determine ideal matches between contractors and consumers.

Examples of machine learning algorithms may include a support vector machine (SVM), a naïve Bayes classification, a random forest, a neural network, deep learning, or other supervised learning algorithm or unsupervised learning algorithm for classification and regression. The machine learning algorithms may be trained using one or more training datasets.

In some embodiments, the machine learning algorithm utilizes regression modelling, wherein relationships between predictor variables and dependent variables are determined and weighted. In one embodiment, for example, a consumers design style is a dependent variable and is derived from the following predictor variables: the consumer's "likes," age, gender, current location, property location, property type, property age, and past project plan details. In another embodiment, a consumer's quality standard is a dependent variable derived from the following predictor variables: the consumer's "likes," current location, property location, project intent and past project details. In yet another embodiment, a consumer's project scope is a dependent variable derived from the following predictor variables: the consumer's location, budget, home area, likes, property type, property age, project intent, past project goals and details.

In some embodiments, the regression modelling techniques allow a recommendation to a user more accurately reflect the scope that the user ultimately wants over time with fewer consumer revisions. In some embodiments, given continued use of both a specific user, the machine (in some embodiments, an engine) learns from a specific user: (a) their general design sensibilities; thus, the machine can initially present images that better reflect a user's design preferences which will require less of the consumer's time to filter through more comprehensive set of images; and (b) their past project plan scope definitions of materials used for each project scope category (e.g., floors: wood, ceramic, carpet, etc. or plumbing fixtures: chrome, nickel brass, etc.) and their quality grade (economy, standard, premium, luxury) selections for each project scope category; and (2) from peer users. In further embodiments, the machine can learn from peer users the most popular pairings of project plan scope items for the consumer's peer set of the following individual categories: age, gender, geographic location, similar/same liked images, budget, and overall quality benchmark. In other embodiments, the machine or engine can assign the following priority to the learnings: (1) consumer's design sensibilities; (2) user's past project plan scope item definitions, if applicable; (3) most popular scope item definitions of peer users with similar budget and similar or same like images; (4) most popular scope item definitions of peer users with similar geographic location and overall quality benchmark; and (5) most popular scope item definitions of peer users with similar age and gender.

In some embodiments, a machine learning algorithm is used to select catalogue images and recommend project scope. A non-limiting example of a multi-variate linear regression model algorithm is seen below:

$$style.contemporary.score = A_0 + A_1(X_1) + A_2(X_2) + A_3(X_3) + A_4(X_4) + A_5(X_5) + A_6(X_6) + A_7(X_7) \ldots$$

wherein $A_i$ ($A_1$, $A_2$, $A_3$, $A_4$, $A_5$, $A_6$, $A_7$, ...) are "weights" or coefficients found during the regression modeling; and $X_i$ ($X_1$, $X_2$, $X_3$, $X_4$, $X_5$, $X_6$, $X_7$, ...) are data collected from the User. Any number of $A_i$ and $X_i$ variable may be included in the model. For example, in a non-limiting example wherein there are 7 $X_i$ terms, $X_1$ is the number of "likes" of images marked as contemporary; $X_2$ is the number of "likes" of images marked as modern (the modeling will determine the degree of correlation of modern to contemporary); $X_3$ is the number of times the user clicked to filter the images by contemporary only; $X_4$ is the number of times the user created a Styleboard with contemporary hotspots in it; $X_5$ is the number of times the user created a project with contemporary elements in it; $X_6$ is the number of times the user submitted an RFP with a project plan with a contemporary design; and $X_7$ is the age/gender classification (the modeling will determine if there's a deterministic correlation to age/gender to design style preferences). In some embodiments, the programming language "R" is used to run the model. In some embodiments, the style.contemporary.scores are computed to determine the user's preference to a contemporary style. In some embodiments, this process is repeated for other style types, such as modern and traditional styles. The scores are used to pre-order/filter catalog images, and recommend project scopes. In some embodiments, linear regression modeling methods are also used to determine material preferences and quality preferences.

In some embodiments, training comprises multiple steps. In a first step, an initial model is constructed by assigning unrefined weights to predictor variables. In a second step, the initial model is used to "recommend" options to the consumer. In a third step, the consumer decides to "select" or "change" the recommendation. If the consumer changes the recommendation to another option, the change data is used to update the model by adjusting the weights of the predictors. The fourth step is to repeat steps one through three continuously or at set intervals.

Digital Processing Device

In some embodiments, the platforms, systems, media, and methods described herein include a digital processing device, or use of the same. In further embodiments, the digital processing device includes one or more hardware central processing units (CPUs) or general purpose graphics processing units (GPGPUs) that carry out the device's functions. In still further embodiments, the digital processing device further comprises an operating system configured to perform executable instructions. In some embodiments, the digital processing device is optionally connected a computer network. In further embodiments, the digital processing device is optionally connected to the Internet such that it accesses the World Wide Web. In still further embodiments, the digital processing device is optionally connected to a cloud computing infrastructure. In other embodiments, the digital processing device is optionally connected to an intranet. In other embodiments, the digital processing device is optionally connected to a data storage device.

In accordance with the description herein, suitable digital processing devices include, by way of non-limiting examples, server computers, desktop computers, laptop computers, notebook computers, sub-notebook computers, netbook computers, netpad computers, set-top computers, media streaming devices, handheld computers, Internet appliances, mobile smartphones, tablet computers, personal digital assistants, video game consoles, and vehicles. Those of skill in the art will recognize that many smartphones are suitable for use in the system described herein. Those of skill in the art will also recognize that select televisions, video players, and digital music players with optional computer network connectivity are suitable for use in the system described herein. Suitable tablet computers include those with booklet, slate, and convertible configurations, known to those of skill in the art.

In some embodiments, the digital processing device includes an operating system configured to perform executable instructions. The operating system is, for example, software, including programs and data, which manages the device's hardware and provides services for execution of applications. Those of skill in the art will recognize that suitable server operating systems include, by way of non-limiting examples, FreeBSD, OpenBSD, NetBSD®, Linux, Apple® Mac OS X Server®, Oracle® Solaris®, Windows Server®, and Novell® NetWare®. Those of skill in the art will recognize that suitable personal computer operating systems include, by way of non-limiting examples, Microsoft® Windows®, Apple® Mac OS X®, UNIX®, and UNIX-like operating systems such as GNU/Linux®. In some embodiments, the operating system is provided by cloud computing. Those of skill in the art will also recognize that suitable mobile smart phone operating systems include, by way of non-limiting examples, Nokia® Symbian® OS, Apple® iOS®, Research In Motion® BlackBerry OS®, Google® Android®, Microsoft® Windows Phone® OS, Microsoft® Windows Mobile® OS, Linux®, and Palm® WebOS®. Those of skill in the art will also recognize that suitable media streaming device operating systems include, by way of non-limiting examples, Apple TV®, Roku®, Boxee®, Google TV®, Google Chromecast®, Amazon Fire®, and Samsung® HomeSync®. Those of skill in the art will also recognize that suitable video game console operating systems include, by way of non-limiting examples, Sony® PS3®, Sony® PS4®, Microsoft® Xbox 360®, Microsoft Xbox One, Nintendo® Wii®, Nintendo® Wii U®, and Ouya®.

In some embodiments, the device includes a storage and/or memory device. The storage and/or memory device is one or more physical apparatuses used to store data or programs on a temporary or permanent basis. In some embodiments, the device is volatile memory and requires power to maintain stored information. In some embodiments, the device is non-volatile memory and retains stored information when the digital processing device is not powered. In further embodiments, the non-volatile memory comprises flash memory. In some embodiments, the non-volatile memory comprises dynamic random-access memory (DRAM). In some embodiments, the non-volatile memory comprises ferroelectric random access memory (FRAM). In some embodiments, the non-volatile memory comprises phase-change random access memory (PRAM). In other embodiments, the device is a storage device including, by way of non-limiting examples, CD-ROMs, DVDs, flash memory devices, magnetic disk drives, magnetic tapes drives, optical disk drives, and cloud computing based storage. In further embodiments, the storage and/or memory device is a combination of devices such as those disclosed herein.

In some embodiments, the digital processing device includes a display to send visual information to a user. In some embodiments, the display is a liquid crystal display (LCD). In further embodiments, the display is a thin film transistor liquid crystal display (TFT-LCD). In some embodiments, the display is an organic light emitting diode (OLED) display. In various further embodiments, on OLED display is a passive-matrix OLED (PMOLED) or active-matrix OLED (AMOLED) display. In some embodiments, the display is a plasma display. In other embodiments, the display is a video projector. In yet other embodiments, the display is a head-mounted display in communication with the digital processing device, such as a VR headset. In further embodiments, suitable VR headsets include, by way of non-limiting examples, HTC Vive, Oculus Rift, Samsung Gear VR, Microsoft HoloLens, Razer OSVR, FOVE VR, Zeiss VR One, Avegant Glyph, Freefly VR headset, and the like. In still further embodiments, the display is a combination of devices such as those disclosed herein.

In some embodiments, the digital processing device includes an input device to receive information from a user. In some embodiments, the input device is a keyboard. In some embodiments, the input device is a pointing device including, by way of non-limiting examples, a mouse, trackball, track pad, joystick, game controller, or stylus. In some embodiments, the input device is a touch screen or a multi-touch screen. In other embodiments, the input device is a microphone to capture voice or other sound input. In other embodiments, the input device is a video camera or other sensor to capture motion or visual input. In further embodiments, the input device is a Kinect, Leap Motion, or the like. In still further embodiments, the input device is a combination of devices such as those disclosed herein.

Non-Transitory Computer Readable Storage Medium

In some embodiments, the platforms, systems, media, and methods disclosed herein include one or more non-transitory computer readable storage media encoded with a program including instructions executable by the operating system of an optionally networked digital processing device. In further embodiments, a computer readable storage medium is a tangible component of a digital processing device. In still further embodiments, a computer readable storage medium is optionally removable from a digital processing device. In some embodiments, a computer readable storage medium includes, by way of non-limiting examples, CD-ROMs, DVDs, flash memory devices, solid state memory, magnetic disk drives, magnetic tape drives, optical disk drives, cloud computing systems and services, and the like. In some cases, the program and instructions are permanently, substantially permanently, semi-permanently, or non-transitorily encoded on the media.

Computer Program

In some embodiments, the platforms, systems, media, and methods disclosed herein include at least one computer program, or use of the same. A computer program includes a sequence of instructions, executable in the digital processing device's CPU, written to perform a specified task. Computer readable instructions may be implemented as program modules, such as functions, objects, Application Programming Interfaces (APIs), data structures, and the like, that perform particular tasks or implement particular abstract data types. In light of the disclosure provided herein, those of skill in the art will recognize that a computer program may be written in various versions of various languages.

The functionality of the computer readable instructions may be combined or distributed as desired in various environments. In some embodiments, a computer program comprises one sequence of instructions. In some embodiments, a computer program comprises a plurality of sequences of instructions. In some embodiments, a computer program is provided from one location. In other embodiments, a computer program is provided from a plurality of locations. In various embodiments, a computer program includes one or more software modules. In various embodiments, a computer program includes, in part or in whole, one or more web applications, one or more mobile applications, one or more standalone applications, one or more web browser plug-ins, extensions, add-ins, or add-ons, or combinations thereof.

Web Application

In some embodiments, a computer program includes a web application. In light of the disclosure provided herein, those of skill in the art will recognize that a web application, in various embodiments, utilizes one or more software frameworks and one or more database systems. In some embodiments, a web application is created upon a software framework such as Microsoft® .NET or Ruby on Rails (RoR). In some embodiments, a web application utilizes one or more database systems including, by way of non-limiting examples, relational, non-relational, object oriented, associative, and XML database systems. In further embodiments, suitable relational database systems include, by way of non-limiting examples, Microsoft® SQL Server, mySQL™, and Oracle®. Those of skill in the art will also recognize that a web application, in various embodiments, is written in one or more versions of one or more languages. A web application may be written in one or more markup languages, presentation definition languages, client-side scripting languages, server-side coding languages, database query languages, or combinations thereof. In some embodiments, a web application is written to some extent in a markup language such as Hypertext Markup Language (HTML), Extensible Hypertext Markup Language (XHTML), or eXtensible Markup Language (XML). In some embodiments, a web application is written to some extent in a presentation definition language such as Cascading Style Sheets (CSS). In some embodiments, a web application is written to some extent in a client-side scripting language such as Asynchronous Javascript and XML (AJAX), Flash® Actionscript, Javascript, or Silverlight®. In some embodiments, a web application is written to some extent in a server-side coding language such as Active Server Pages (ASP), ColdFusion®, Perl, Java™, JavaServer Pages (JSP), Hypertext Preprocessor (PHP), Python™, Ruby, Tcl, Smalltalk, WebDNA®, or Groovy. In some embodiments, a web application is written to some extent in a database query language such as Structured Query Language (SQL). In some embodiments, a web application integrates enterprise server products such as IBM® Lotus Domino®. In some embodiments, a web application includes a media player element. In various further embodiments, a media player element utilizes one or more of many suitable multimedia technologies including, by way of non-limiting examples, Adobe® Flash®, HTML 5, Apple® QuickTime®, Microsoft® Silverlight®, Java™, and Unity®.

Mobile Application

In some embodiments, a computer program includes a mobile application provided to a mobile digital processing device. In some embodiments, the mobile application is provided to a mobile digital processing device at the time it is manufactured. In other embodiments, the mobile application is provided to a mobile digital processing device via the computer network described herein.

In view of the disclosure provided herein, a mobile application is created by techniques known to those of skill in the art using hardware, languages, and development environments known to the art. Those of skill in the art will recognize that mobile applications are written in several languages. Suitable programming languages include, by way of non-limiting examples, C, C++, C#, Objective-C, Java™, Javascript, Pascal, Object Pascal, Python™, Ruby, VB.NET, WML, and XHTML/HTML with or without CSS, or combinations thereof.

Suitable mobile application development environments are available from several sources. Commercially available development environments include, by way of non-limiting examples, AirplaySDK, alcheMo, Appcelerator®, Celsius, Bedrock, Flash Lite, .NET Compact Framework, Rhomobile, and WorkLight Mobile Platform. Other development environments are available without cost including, by way of non-limiting examples, Lazarus, MobiFlex, MoSync, and Phonegap. Also, mobile device manufacturers distribute software developer kits including, by way of non-limiting examples, iPhone and iPad (iOS) SDK, Android™ SDK, BlackBerry® SDK, BREW SDK, Palm® OS SDK, Symbian SDK, webOS SDK, and Windows® Mobile SDK.

Those of skill in the art will recognize that several commercial forums are available for distribution of mobile applications including, by way of non-limiting examples, Apple® App Store, Google® Play, Chrome WebStore, BlackBerry® App World, App Store for Palm devices, App Catalog for webOS, Windows® Marketplace for Mobile, Ovi Store for Nokia® devices, Samsung® Apps, and Nintendo® DSi Shop.

Standalone Application

In some embodiments, a computer program includes a standalone application, which is a program that is run as an independent computer process, not an add-on to an existing process, e.g., not a plug-in. Those of skill in the art will recognize that standalone applications are often compiled. A compiler is a computer program(s) that transforms source code written in a programming language into binary object code such as assembly language or machine code. Suitable compiled programming languages include, by way of non-limiting examples, C, C++, Objective-C, COBOL, Delphi, Eiffel, Java™, Lisp, Python™, Visual Basic, and VB .NET, or combinations thereof. Compilation is often performed, at least in part, to create an executable program. In some embodiments, a computer program includes one or more executable complied applications.

Web Browser Plug-in

In some embodiments, the computer program includes a web browser plug-in (e.g., extension, etc.). In computing, a plug-in is one or more software components that add specific functionality to a larger software application. Makers of software applications support plug-ins to enable third-party developers to create abilities which extend an application, to support easily adding new features, and to reduce the size of an application. When supported, plug-ins enable customizing the functionality of a software application. For example, plug-ins are commonly used in web browsers to play video, generate interactivity, scan for viruses, and display particular file types. Those of skill in the art will be familiar with several web browser plug-ins including, Adobe® Flash® Player, Microsoft® Silverlight®, and Apple® QuickTime®.

In view of the disclosure provided herein, those of skill in the art will recognize that several plug-in frameworks are available that enable development of plug-ins in various programming languages, including, by way of non-limiting examples, C++, Delphi, Java™, PHP, Python™, and VB .NET, or combinations thereof.

Web browsers (also called Internet browsers) are software applications, designed for use with network-connected digital processing devices, for retrieving, presenting, and traversing information resources on the World Wide Web. Suitable web browsers include, by way of non-limiting examples, Microsoft® Internet Explorer®, Mozilla® Firefox®, Google® Chrome, Apple® Safari®, Opera Software® Opera®, and KDE Konqueror. In some embodiments, the web browser is a mobile web browser. Mobile web browsers (also called mircrobrowsers, mini-browsers, and wireless browsers) are designed for use on mobile digital processing devices including, by way of non-limiting examples, handheld computers, tablet computers, netbook computers, subnotebook computers, smartphones, music players, personal digital assistants (PDAs), and handheld video game systems. Suitable mobile web browsers include, by way of non-limiting examples, Google® Android® browser, RIM BlackBerry® Browser, Apple® Safari®, Palm® Blazer, Palm® WebOS® Browser, Mozilla® Firefox® for mobile, Microsoft® Internet Explorer® Mobile, Amazon® Kindle® Basic Web, Nokia® Browser, Opera Software® Opera® Mobile, and Sony® PSP™ browser.

Software Modules

In some embodiments, the platforms, systems, media, and methods disclosed herein include software, server, and/or database modules, or use of the same. In view of the disclosure provided herein, software modules are created by techniques known to those of skill in the art using machines, software, and languages known to the art. The software modules disclosed herein are implemented in a multitude of ways. In various embodiments, a software module comprises a file, a section of code, a programming object, a programming structure, or combinations thereof. In further various embodiments, a software module comprises a plurality of files, a plurality of sections of code, a plurality of programming objects, a plurality of programming structures, or combinations thereof. In various embodiments, the one or more software modules comprise, by way of non-limiting examples, a web application, a mobile application, and a standalone application. In some embodiments, software modules are in one computer program or application. In other embodiments, software modules are in more than one computer program or application. In some embodiments, software modules are hosted on one machine. In other embodiments, software modules are hosted on more than one machine. In further embodiments, software modules are hosted on cloud computing platforms. In some embodiments, software modules are hosted on one or more machines in one location. In other embodiments, software modules are hosted on one or more machines in more than one location.

Databases

In some embodiments, the platforms, systems, media, and methods disclosed herein include one or more databases, or use of the same. In various embodiments, suitable databases include, by way of non-limiting examples, relational databases, non-relational databases, object oriented databases, object databases, entity-relationship model databases, associative databases, and XML databases. Further non-limiting examples include SQL, PostgreSQL, MySQL, Oracle, DB2, and Sybase. In some embodiments, a database is internet-based. In further embodiments, a database is web-based. In still further embodiments, a database is cloud computing-based. In other embodiments, a database is based on one or more local computer storage devices.

EXAMPLES

The following illustrative examples are representative of embodiments of the software applications, systems, and methods described herein and are not meant to be limiting in any way.

Example 1—Consumer Experience

Consumer Milly N. Neil would like to renovate her kitchen, but is unclear on what aesthetic she prefers and how much kitchen renovations cost. Although Milly watches home design programs all day, she has yet to discover the style of renovation she would like for her own home. Instead of taking time off from work to meet with contractors for opinions and quotes, Milly spends small amounts of her evening exploring the computer-implemented system, media, and methods disclosed herein. Milly browses a catalogue of images and indicates her preferred styles and her favorite items. Milly uses the "kitchen" filter to bring up images of kitchens to increase the efficiency of her review. Milly reviews her favorite images and creates a Styleboard that specifies examples of her preferred plumbing fixtures, wall backsplashes, countertops, flooring, and lighting. Milly specifies information about the location of the project, dimensions of the kitchen, a maximum budget, and project logistics. Milly obtains an estimate of her project and finds that the estimate is significantly below her maximum budget. Milly decides to upgrade the plumbing fixtures by updating her styleboard, and the costs are dynamically recalculated in real time. Milly generates an RFP and submits the RFP for bids. Milly receives five bids, and she invites three contractors to her home for an interview and on-site evaluation. The three contractors provide final bids and Milly selects the contractor who understands her vision and offers a competitive price. By using the claimed system, media, and methods, Milly avoided being inundated with options, but was able to effectively and quickly find the best contractor for the job.

Example 2—Contractor Experience

Contractor Bill has availability for the next 2 months due to a last minute contract cancelation. In Bill's experience, new jobs can take weeks to find, and most take longer than 2 months to complete. Bill enters his availability into the computer-implemented system disclosed herein and begins to receive a steady stream of potential RFPs that he can bid on. Bill lives in the forest, and many jobs require long travel times and would subtract from his profits. Bill passes on these RFPs and eventually finds a nearby project with low overhead costs. Bill reviews bids submitted by other contractors, and is able to provide a lower bid while still maintaining a healthy profit. The consumer invites Bob for a site interview, and Bob submits a final bid. Bob receives the contract, performs the work, and moves onto his next project on time.

Example 3—Real Time Training of Machine Learning Algorithms

Consumer Alex has provided the computer-implemented system disclosed herein with his age, gender, and property location. Alex is a 24 year old male living in Detroit. Alex selects the bedroom filter in the "DREAM IT" section of the application to begin selecting images and determine his preferences for the bedroom remodel. A machine learning algorithm is used to determine which images to show Alex and determine his desired style type. The initial model for his data points heavily weights the predictor variables of age and gender, and the style of images shown to Alex are industrial, masculine, and cold. However, Alex would like to design a nursery for a baby girl on the way. While Alex selects a few of the masculine images to view at first, he does not select any elements as his "likes," and quickly moves past the predicted images. The machine learning algorithm takes into account the lack of selected images, along with the clickstream of the consumer, and adjusts the weights associated with the predictive variables. Alex begins to find images of items appropriate for a nursery and begins selecting the items and decor that he prefers. The machine learning algorithm updates the weights to provide similar images and soon thereafter Alex's images are exclusively that of nursery design projects. Alex compiles a Styleboard and moves forward with generating an RFP. Years later, Alex seeks to update the nursery into a child's room with light renovations, a build-in bookshelf, and a built-in toy chest. The machine learning algorithm takes into account Alex's past project, the age of the room, and years of data from similar third party users. The machine learning algorithm presents Alex with images of children's bedrooms when Alex begins compiling his new Styleboard.

Example 4—Linear Regression Modelling

A machine learning algorithm is used to select catalogue images and recommend project scope. The algorithm is a multi-variate linear regression model of the type:

$$\text{style.contemporary.score} = A_0 + A_1(X_1) + A_2(X_2) + A_3(X_3) + A_4(X_4) + A_5(X_5) + A_6(X_6) + A_7(X_7)$$

wherein:

$A_1$, $A_2$, $A_3$, $A_4$, $A_5$, $A_6$, and $A_7$, are "weights" or coefficients found during the regression modeling;

R is used to run the model;

$X_1$ is the number of "likes" of images marked as contemporary;

$X_2$ is the number of "likes" of images marked as modern (the modeling will determine the degree of correlation of modern to contemporary);

$X_3$ is the number of times the user clicked to filter the images by contemporary only;

$X_4$ is the number of times the user created a Styleboard with contemporary hotspots in it;

$X_5$ is the number of times the user created a project with contemporary elements in it;

$X_6$ is the number of times the user submitted an RFP with a project plan with a contemporary design; and $X_7$ is the age/gender classification (the modeling will determine if there's a deterministic correlation to age/gender to design style preferences).

The style.contemporary.scores are computed to determine the user's preference to a contemporary style. This process is repeated for other style types, such as modern and traditional styles. The scores are used to pre-order/filter catalog images, and recommend project scopes. Linear regression modeling methods are also used to determine material preferences and quality preferences.

While preferred embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure.

What is claimed is:

1. A computer-implemented system comprising: a computer-readable storage device coupled to the at least one processor and having instructions stored thereon which, when executed by the at least one processor, cause the at least one processor to perform operations comprising:
   a) receiving, from a user interface, project profile data for a user;
   b) determining a plurality of peer users based on the project profile data;
   c) training a first machine learning algorithm using a plurality of user profiles for the peer users;
   d) assigning unrefined weights to predictor variables of the first machine learning algorithm;
   e) processing the project profile data through the first machine learning algorithm to determine a plurality of recommended options, the recommended options comprising a plurality of independently selectable sub-regions;
   f) providing the recommended options to the user interface;
   g) receiving, from the user interface, a data set comprising selections of the independently selectable sub-regions;
   h) adjusting the predictor variables of the first machine learning algorithm based on the selections of the independently selectable sub-regions;
   i) processing the data set, and the project profile data through the first machine learning algorithm to generate a proposed project plan, the proposed project plan comprising a plurality of project line items;
   j) training a second machine learning algorithm using verified data for a plurality of implemented property construction projects, the verified data comprising projects material costs, labor costs, overhead costs, profits, or contingency costs for the implemented property construction projects;
   k) processing the proposed project plan through the second machine learning algorithm to generate a dynamic cost estimate for the proposed project plan, the dynamic cost estimate comprising itemized cost estimates for each of the project line items;
   l) providing, to the user interface, the dynamic cost estimate for the proposed project plan;
   m) receiving, from the user interface, a finalized project scope, the finalized project scope comprising sections from the dynamic cost estimate;
   n) generating a digital request for proposal based on the finalized project scope; and
   o) providing the digital request for proposal to the user interface.

2. The system of claim 1, wherein the project profile data comprises an Internet Protocol address, zip code data, geographical data, a property address, a clickstream, a budget for a project, a scope for the project, a room specification, a user's quality preference, or a project specification.

3. The system of claim 1, wherein the proposed project plan comprises a visual summary, a cost breakdown of each aspect of the proposed project plan, a Styleboard, or a pie chart.

4. The system of claim 1, wherein the operations comprise:
   receiving a non-user data set from a non-user.

5. The system of claim 4, wherein the operations comprise:
   training the first machine learning algorithm with the non-user data set to improve the generation of proposed project plan.

6. The system of claim 1, wherein the proposed project plan comprises a plurality of adjustable parameters.

7. The system of claim 1, wherein the second machine learning algorithm comprises a categorical cost of index adjustment by zip code and hierarchical cost data.

8. The system of claim 1, wherein the second machine learning algorithm comprises a quantity manager comprising tethered quantity rules, overage rules, project quality adjustments rules, home area adjustment rules, home type, age, or room specification adjustment rules.

9. The system of claim 1, wherein the second machine learning algorithm comprises extensible rule set comprising scenario exclusions, attributes inheritance, scope tethering, reverse tethering, default scope selection by project quality, default scope selection by budget, default scope plan by project scale, or default scope plan by budget.

10. The system of claim 1, wherein the verified data is acquired from actual bids from contractors.

11. The system of claim 1, wherein the operations comprise:
   a) training a third machine learning algorithm trained with property construction project data;
   b) processing the digital request for proposal through the third machine learning algorithm to determine at least one service provider from a plurality of service providers; and
   c) providing the digital request for proposal to the at least one service provider as a bid.

12. The system of claim 11, wherein the third machine learning algorithm comprises a scoring analysis, a thresholding analysis, and a scheduler analysis.

13. The system of claim 12, wherein the scoring analysis comprises an analysis based on project expertise requirements, quality craftsmanship, project scale, service area, service provider ratings, activity score, bid response score, service provider booking, and service provider schedule.

14. The system of claim 13, wherein the scheduler analysis comprises an analysis based on a speed of bid submissions over time or changes in the third machine learning algorithm.

15. The system of claim 12, wherein the operations comprise:
   providing a notification regarding a status of the bid to the user and the at least one service provider.

16. The system of claim 1, wherein the project profile data comprises an age of a user, a gender of the user, a geographic location of the user, similar or liked images for the user, budget of a project, and overall quality benchmark for the project.

17. The system of claim 1, wherein the operations comprise:
   training the first machine learning algorithm using a plurality of past project plans generated for the user.

18. The system of claim 1, wherein the operations comprise:
   processing the data set, and the project profile data through the first machine learning algorithm to generate a user profile for the user, the user profile comprising an intent of the user, a plurality of preferences of the user, and the proposed project plan.

19. The system of claim 18, wherein the user profile comprises the user's quality sensibilities, the user's design sensibilities, the user's material preferences, the user's looks preferences, the user's budget, a property type, a property age, a room specification by type, or level of attention to detail.

20. The system of claim 1, wherein the data set comprises clickstream data or selected design elements.

21. Non-transitory computer-readable storage media encoded with a computer program including instructions executable by a processor to create a digital request for proposal, the instructions comprising:
   a) receiving, from a user interface, project profile data for a user;
   b) determining a plurality of peer users based on the project profile data;
   c) training a first machine learning algorithm using a plurality of user profiles for the peer users;
   d) assigning unrefined weights to predictor variables of the first machine learning algorithm; and
   e) processing the project profile data through the first machine learning algorithm to determine a plurality of recommended options, the recommended options comprising a plurality of independently selectable sub-regions;
   f) providing the recommended options to the user interface;
   g) receiving, from the user interface, a data set comprising selections of the independently selectable sub-regions;
   h) adjusting the predictor variables of the first machine learning algorithm based on the selections of the independently selectable sub-regions;
   i) processing the data set, and the project profile data through the first machine learning algorithm to generate a proposed project plan, the proposed project plan comprising a plurality of project line items;
   j) training a second machine learning algorithm using verified data for a plurality of implemented property construction projects, the verified data comprising projects material costs, labor costs, overhead costs, profits, or contingency costs for the implemented property construction projects;
   k) processing the proposed project plan through the second machine learning algorithm to generate a dynamic cost estimate for the proposed project plan, the dynamic cost estimate comprising itemized cost estimates for each of the project line items;
   l) providing, to the user interface, the dynamic cost estimate for the proposed project plan;
   m) receiving, from the user interface, a finalized project scope, the finalized project scope comprising sections from the dynamic cost estimate;
   n) generating a digital request for proposal based on the finalized project scope; and
   o) providing the digital request for proposal to the user interface.

22. The media of claim 21 further comprising:
   a) training a third machine learning algorithm trained with property construction project data
   b) processing the digital request for proposal through the third machine learning algorithm to determine at least one service provider from a plurality of service providers; and
   c) providing the digital request for proposal to the at least one service provider as a bid.

23. A computer-implemented method for creating a digital request for proposal comprising:
   a) receiving, from a user interface, project profile data for a user;
   b) determining a plurality of peer users based on the project profile data;
   c) training a first machine learning algorithm using a plurality of user profiles for the peer users;
   d) assigning unrefined weights to predictor variables of the first machine learning algorithm;
   e) processing the project profile data through the first machine learning algorithm to determine a plurality of recommended options, the recommended options comprising a plurality of independently selectable sub-regions;
   f) providing the recommended options to the user interface;
   g) receiving, from the user interface, a data set comprising selections of the independently selectable sub-regions;
   h) adjusting the predictor variables of the first machine learning algorithm based on the selections of the independently selectable sub-regions;
   i) processing the data set, and the project profile data through the first machine learning algorithm to generate a proposed project plan, the proposed project plan comprising a plurality of project line items;
   j) training a second machine learning algorithm using verified data for a plurality of implemented property construction projects, the verified data comprising projects material costs, labor costs, overhead costs, profits, or contingency costs for the implemented property construction projects;
   k) processing the proposed project plan through the second machine learning algorithm to generate a dynamic cost estimate for the proposed project plan, the dynamic cost estimate comprising itemized cost estimates for each of the project line items;
   l) providing, to the user interface, the dynamic cost estimate for the proposed project plan;
   m) receiving, from the user interface, a finalized project scope, the finalized project scope comprising sections from the dynamic cost estimate;
   n) generating a digital request for proposal based on the finalized project scope; and
   o) providing the digital request for proposal to the user interface.

* * * * *